(12) United States Patent
Burns et al.

(10) Patent No.: US 7,634,244 B2
(45) Date of Patent: *Dec. 15, 2009

(54) VARIABLE-GAIN LOW NOISE AMPLIFIER FOR DIGITAL TERRESTRIAL APPLICATIONS

(75) Inventors: Lawrence M. Burns, Los Altos, CA (US); Charles Brooks, Laguna Beach, CA (US); Leonard Dauphinee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 472 days.

This patent is subject to a terminal disclaimer.

(21) Appl. No.: 11/139,619

(22) Filed: May 31, 2005

(65) Prior Publication Data

US 2005/0208910 A1    Sep. 22, 2005

Related U.S. Application Data

(63) Continuation of application No. 11/030,882, filed on Jan. 10, 2005, now Pat. No. 7,260,377, and a continuation-in-part of application No. 10/822,729, filed on Apr. 13, 2004, which is a continuation-in-part of application No. 10/353,940, filed on Jan. 30, 2003, and a continuation-in-part of application No. 10/353,939, filed on Jan. 30, 2003, now Pat. No. 6,798,286, which is a continuation-in-part of application No. 10/353,939.

(60) Provisional application No. 60/430,061, filed on Dec. 2, 2002, provisional application No. 60/572,608, filed on May 20, 2004.

(51) Int. Cl.
*H04B 1/06* (2006.01)

(52) U.S. Cl. ............... 455/240.1; 455/333; 455/340; 375/345; 330/254

(58) Field of Classification Search ............... 330/254, 330/276; 455/334, 335, 341, 230, 232.1, 455/234.1, 240.1, 250.1, 313, 318, 323, 333, 455/338, 340; 375/345
See application file for complete search history.

(56) References Cited

U.S. PATENT DOCUMENTS 4,066,977 A    1/1978    Chambers et al.

(Continued)

FOREIGN PATENT DOCUMENTS

| JP | 7-183344 | 7/1995 |
|---|---|---|
| NL | 8203979 | 5/1984 |

OTHER PUBLICATIONS

International Search Report issued Aug. 28, 2002 for Appln. No. PCT/US01/21022, 6 pages.

(Continued)

*Primary Examiner*—Nhan T Le
(74) *Attorney, Agent, or Firm*—Sterne, Kessler, Goldstein & Fox, P.L.L.C.

(57) ABSTRACT

A multi-stage amplifier assembly configured to receive a terrestrial digital television ("DTV") input signal including multiple frequency channels. The amplifier assembly optionally includes a PIN diode coupled across differential inputs to a first stage of the multi-stage amplifier assembly. The PIN diode is controlled to attenuate the input when an exceptionally large signal is present in a channel adjacent to a desired channel. The PIN diode, essentially a variable resistor, permits the multi-stage amplifier assembly to maintain dynamic range in such situations for reasonable tradeoffs. The amplifier assembly further optionally includes an out-of-band second stage LNA. The amplifier assembly further optionally includes a multi-band input filter. The multi-band filer insures that the AGC operates on the TV band of interest, thus improving the linearity of the system. The invention can be implemented in CMOS and/or SiGe.

21 Claims, 27 Drawing Sheets

U.S. PATENT DOCUMENTS

| | | | |
|---|---|---|---|
| 4,159,514 A | 6/1979 | Kakalec | |
| 4,177,819 A | 12/1979 | Kofsky et al. | |
| 4,354,216 A | 10/1982 | Volta | |
| 4,402,089 A * | 8/1983 | Knight et al. | 455/186.1 |
| 4,796,142 A | 1/1989 | Libert | |
| 4,870,372 A | 9/1989 | Suter | |
| 4,943,706 A | 7/1990 | Lyall et al. | |
| 5,077,541 A | 12/1991 | Gilbert | |
| 5,150,123 A | 9/1992 | Orlowski et al. | |
| 5,432,478 A | 7/1995 | Gilbert | |
| 5,621,355 A | 4/1997 | Williams et al. | |
| 5,684,431 A | 11/1997 | Gilbert et al. | |
| 5,764,655 A | 6/1998 | Kirihata et al. | |
| 5,774,319 A | 6/1998 | Carter et al. | |
| 5,781,766 A | 7/1998 | Davis | |
| 5,831,446 A | 11/1998 | So et al. | |
| 6,002,356 A | 12/1999 | Cooper | |
| 6,040,737 A | 3/2000 | Ranjan et al. | |
| 6,088,806 A | 7/2000 | Chee | |
| 6,118,499 A * | 9/2000 | Fang | 348/726 |
| 6,154,715 A | 11/2000 | Dintemann et al. | |
| 6,163,862 A | 12/2000 | Adams et al. | |
| 6,232,908 B1 | 5/2001 | Nakaigawa | |
| 6,239,603 B1 | 5/2001 | Ukei et al. | |
| 6,255,906 B1 | 7/2001 | Eidson et al. | |
| 6,282,038 B1 | 8/2001 | Bonaccio et al. | |
| 6,288,609 B1 | 9/2001 | Brueske et al. | |
| 6,357,025 B1 | 3/2002 | Tuttle | |
| 6,369,618 B1 * | 4/2002 | Bloodworth et al. | 327/103 |
| 6,377,117 B2 | 4/2002 | Oskowsky et al. | |
| 6,535,013 B2 | 3/2003 | Samaan | |
| 6,538,507 B2 | 3/2003 | Prentice et al. | |
| 6,577,196 B2 | 6/2003 | Hart | |
| 6,597,898 B1 | 7/2003 | Iwata et al. | |
| 6,600,374 B2 | 7/2003 | Nguyen et al. | |
| 6,608,524 B2 | 8/2003 | Kawabe et al. | |
| 6,621,345 B2 | 9/2003 | Matsugatani et al. | |
| 6,625,433 B1 | 9/2003 | Poirier et al. | |
| 6,714,036 B2 | 3/2004 | Figueras et al. | |
| 6,727,759 B2 | 4/2004 | Nguyen et al. | |
| 6,769,081 B1 | 7/2004 | Parulkar | |
| 6,785,626 B2 | 8/2004 | Corr | |
| 6,798,286 B2 | 9/2004 | Dauphinee et al. | |
| 6,853,315 B2 | 2/2005 | Schiller et al. | |
| 6,879,816 B2 | 4/2005 | Bult et al. | |
| 7,068,100 B2 | 6/2006 | Dauphinee et al. | |
| 7,183,845 B2 | 2/2007 | Dauphinee et al. | |
| 7,260,377 B2 * | 8/2007 | Burns et al. | 455/341 |
| 7,501,888 B2 | 3/2009 | Dauphinee et al. | |
| 2002/0042256 A1 * | 4/2002 | Baldwin et al. | 455/232.1 |
| 2002/0131533 A1 * | 9/2002 | Koizumi | 375/345 |
| 2002/0160711 A1 | 10/2002 | Carlson et al. | |
| 2002/0180521 A1 * | 12/2002 | Taylor | 330/129 |
| 2003/0034838 A1 | 2/2003 | Fanous et al. | |
| 2004/0013209 A1 * | 1/2004 | Zehavi et al. | 375/334 |
| 2004/0077326 A1 * | 4/2004 | Shi | 455/313 |
| 2004/0104740 A1 | 6/2004 | Burns et al. | |
| 2004/0105033 A1 * | 6/2004 | Dauphinee et al. | 348/678 |
| 2004/0108866 A1 | 6/2004 | Burns et al. | |
| 2004/0166799 A1 | 8/2004 | Kral | |
| 2004/0189382 A1 | 9/2004 | Dauphinee et al. | |
| 2005/0062491 A1 | 3/2005 | Burns et al. | |
| 2005/0130617 A1 | 6/2005 | Burns et al. | |
| 2007/0159244 A1 | 7/2007 | Dauphinee et al. | |
| 2009/0066414 A1 | 3/2009 | Dauphinee et al. | |

OTHER PUBLICATIONS

Sam, B., "Direct Conversion Receiver for Wide-band CDMA," Wireless Symposium, pp. 1-5, (Spring 2000).

Allen. P., et al., "CMOS Analog Circuit Design", Saunders College Publishing, 1987, pp. 58-66 and 76-86.

Johns, D., et al., "Analog Integrated Circuit Design", John Wiley & Sons, Inc., 1997, pp. 16-39 and 57-60.

* cited by examiner

VARIABLE-GAIN LOW NOISE AMPLIFIER FOR DIGITAL TERRESTRIAL APPLICATIONS

CROSS-REFERENCE TO RELATED APPLICATIONS

This application is a Continuation of U.S. patent application Ser. No. 11/030,882, filed Jan. 10, 2005, which is a Continuation-In-Part of U.S. Non-Provisional application Ser. No. 10/353,940, filed Jan. 30, 2003, entitled, "Amplifier Assembly Including Variable Gain Amplifier, Parallel Programmable Amplifiers, and AGC," and a Continuation-In-Part of U.S. Non-Provisional application Ser. No. 10/353,939, filed Jan. 30, 2003, entitled "Gain Control Methods and Systems in an Amplifier Assembly," now issued as U.S. Pat. No. 6,798,286, both of which claim priority to U.S. Provisional Application No. 60/430,061, filed Dec. 2, 2002, entitled "Amplifier Assembly with AGC for a Tuner," all of which are incorporated herein by reference in their entireties.

U.S. patent application Ser. No. 11/030,882 is a Continuation-in-Part of U.S. patent application Ser. No. 10/882,729, filed Apr. 13, 2004, entitled "Gain Control Methods and Systems in an Amplifier Assembly," which is a continuation of U.S. patent application Ser. No. 10/353,939, filed Jan. 30, 2003, which claims priority to U.S. Provisional Application No. 60/430,061, filed Dec. 2, 2002, all of which are incorporated herein by reference in their entireties.

U.S. patent application Ser. No. 11/030,882 claims priority to U.S. Provisional Application No. 60/572,608, filed May 20, 2004, entitled "A Variable-Gain Low Noise Amplifier For Digital Terrestrial Applications," which is incorporated herein by reference in its entirety.

BACKGROUND OF THE INVENTION

1. Field of the Invention

The present invention relates generally to variable gain amplifier (VGA) assemblies and components thereof, gain control in such assemblies, and applications of the same.

2. Related Art

VGA assemblies are known in the art. What is needed is a more linear, lower noise, less costly amplifier assembly for providing variable amplifier gain in a variety of applications, such as those including multiple tuners for cable television, data signal applications, and terrestrial digital television ("DTV").

SUMMARY OF THE INVENTION

Various embodiments of the present invention are directed, for example, to an amplifier assembly and components/modules used therein, gain control in the amplifier assembly, and associated methods. In an embodiment, an amplifier assembly receives an input signal including multiple frequency channels. The amplifier assembly includes a first stage amplifier that amplifies the input signal, to produce at an output thereof an amplified first signal including the multiple frequency channels. One or more second stage amplifiers have their respective inputs coupled to an output of the first stage amplifier. Each second stage amplifier amplifies the amplified first signal, to produce at its respective output a respective second amplified signal including the multiple frequency channels. The first stage amplifier and the second stage amplifiers are variable gain amplifiers, and are constructed on a common Integrated Circuit (IC) substrate.

In another embodiment, an amplifier assembly comprises: an IC substrate; a first stage Variable Gain Amplifier (VGA) configured to have a gain controlled in response to one or more gain control signals; a plurality of parallel second stage Variable Gain Amplifiers (VGAs) having their respective inputs coupled to an output of the VGA; an AGC module configured to generate the one or more control signals responsive to a power of an amplified signal produced by the first stage VGA; a control interface coupled to the first stage VGA, each of the second stage VGAs, and the AGC module; and wherein the first stage VGA, each of the second stage VGAs, and the control interface, and at least a portion of the AGC module are all constructed on the IC substrate.

According to another embodiment, a system for processing an input signal including multiple television (TV) channels, comprises: an amplifier assembly configured to produce, from the input signal, multiple amplified output signals in parallel with each other, each amplified output signal including the multiple TV channels; multiple tuners, each tuner corresponding to a respective one of the multiple amplified signals, each tuner configured to select a subset of the multiple TV channels in the corresponding amplified signal, and to produce a corresponding tuned signal including the selected subset of TV channels; and multiple demodulators, each demodulator corresponding to a respective one of the tuned signals, each demodulator configured to demodulate at least one of the selected subset of TV channels in the corresponding tuned signal, to produce a corresponding demodulated TV signal.

The invention, and portions thereof, can be used with cable TV (e.g., NTSC, digital TV and cable modem) and/or terrestrial digital TV ("DTV").

The invention further includes an optional positive-intrinsic-negative ("PIN") diode at an RF input. A PIN diode is a semiconductor device that operates as a variable resistor at RF and microwave frequencies. The resistance value of the PIN diode is determined by a forward biased DC current. PIN diodes can control relatively large RF signals while using relatively small levels of DC excitation. The PIN diode provides a relatively simple and inexpensive way to dynamically adjust attenuation. The attenuation can be used, for example, when a relatively powerful unwanted signal is present at the input.

The invention further includes an optional switched low noise amplifier ("LNA") first stage that provides independently controlled LNAs for different inputs. The different inputs can be, for example, from an antenna and from a cable.

The invention further includes an optional out-of-band ("OOB") second stage amplifier for processing data embedding in otherwise unused channels within the cable band, such as in a FM band.

The invention further includes an optional dynamic multi-band input filter to selectively pass a desired band for processing. The input filter improves linearity, among other features.

Other embodiments of the present invention are apparent from the ensuing description.

BRIEF DESCRIPTION OF THE DRAWINGS/FIGURES

In the drawings, like reference numbers indicate identical or functionally similar elements.

DETAILED DESCRIPTION OF THE INVENTION

Glossary

AGC—automatic gain control.
CATV—Community Antenna Television.
CI—Control Interface.
CMOS—Complementary Metal Oxide Semiconductor.
FET—Field Effect Transistor.
IC—Integrated Circuit.
VGA—Variable Gain Amplifier.
QAM: Quadrature Amplitude Modulated.
QPSK: Quadrature Phase Shift Keyed.
Television (TV) Standards:
  NTSC—National Television System Committee.
  PAL—Phase Alternating Line.
  SECAM—Sequential Color with Memory (French).

I. Overview

In a Community Antenna Television (CATV) system (also referred to as cable TV), a plurality of signals are frequency division multiplexed onto one or more coaxial cables. The CATV system has a downstream band or aggregate signal (headend-to-user) and an upstream band or aggregate signal (user-to-headend). In the downstream band, there can be approximately 135 channels having frequencies that range from 50 MHz to 860 MHz. The individual downstream channels represent different television signals that can be a mixture of analog television signals or digital signals. The analog television signals are preferably NTSC or PAL compliant television signals. The digital television signals carry digital video or cable modem data (e.g. internet traffic), and are typically modulated using 64 QAM or 256 QAM. Other outputs include a buffered version of an input (bypass function) and out-of-band (OOB) control signals.

While the amplitude of each signal varies as a function of the information being transmitted on that channel, the amplitude of the combined signal on the cable will vary not only as a function of the amplitude of each of the individual signals, but also as a function of the phase and amplitude relationship of each channel with respect to the others. Thus, the overall amplitude of the signal will be time varying as the phase and amplitude of each of the individual signals line up. As an example, an amplifier used in a tuner that receives the downstream signal has to have good distortion performance when 135 channels, each at 0 Decibel-milliVolts (dBmV), are fed to the amplifier input. When the input level is increased to +15 dBmV on each channel, the amplifier must attenuate the input level back down to the same output level as in the case when all channels were at 0 dBmV, while maintaining good distortion performance.

Figure 1:
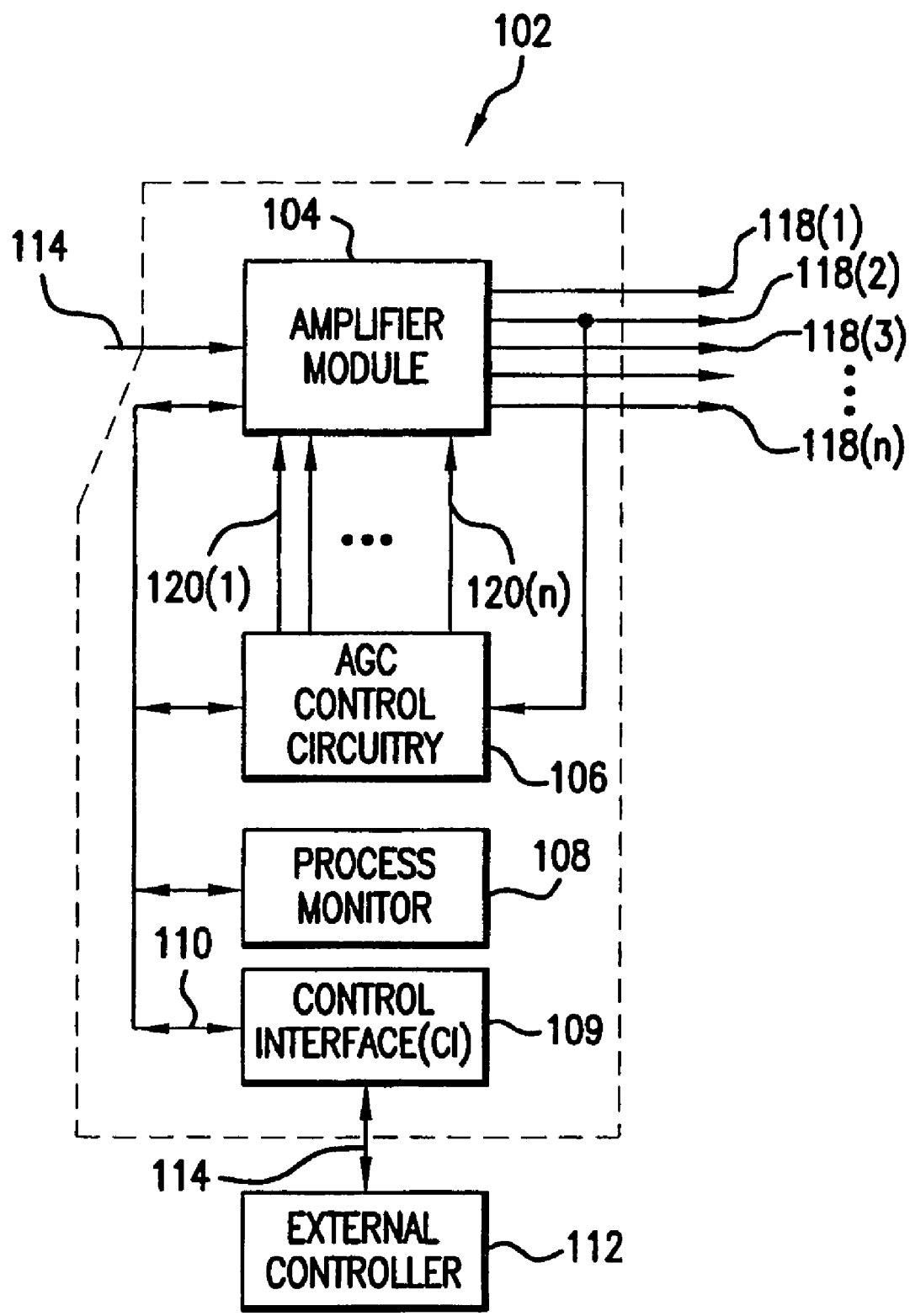
FIG. 1 is a block diagram of an example VGA assembly for use in a tuner.

FIG. 1 is a block diagram of an exemplary amplifier assembly 102 for use in a tuner for CATV, for example. Amplifier assembly 102 includes a VGA amplifier module 104, AGC control circuitry or module 106 for controlling a gain of the VGA amplifier module, a process monitor 108. Amplifier assembly 102 also includes a control interface (CI) 109 for controlling and monitoring amplifier module 104, AGC module 106, and process monitor 108, over a control bus 110. An external controller 112 controls and receives status information from amplifier assembly 102, over an external control bus 114 coupled to CI 109. External control bus 114 may be a digital control bus including serial data lines and a clock line, for example. CI 109 may be an analog or digital controller, and control bus 110 may be an analog or digital control bus.

Amplifier module 104 receives a signal 114 including downstream channels spanning 54-860 MHz, for example. Signal 114 may include TV channels formatted according to NTSC, PAL, or SECAM standards, for example. Signal 114 may also include channels carrying digital data. Amplifier module 104 amplifies receive signal 114 in accordance with a gain of the amplifier module and divides or power-splits the resulting amplified receive signal, to produce a plurality of individual, separate amplified receive signals 118(1)-118(n). Amplifier assembly 102 produces signals 118(1)-118(n) in parallel with one another. Each signal 118(i) represents an amplified version of receive signal 114. Each of amplified signals 118 is associated with its own gain, and thus, may have a different power level than the other of amplified signals 118. The interchangeable terms "gain" and "gain value" as used herein are general, and are intended to include positive, negative or zero gain. Thus, an amplifier having a gain may amplify a signal at a first power level, to produce an amplified signal at a second power level. The second power level may be greater than, less than, or equal to the first power level, depending on whether the gain is positive, negative, or zero, respectively.

In response to a power level of one of amplified signals 118 (e.g., signal 118(2)), AGC module 106 generates one or more gain control signals 120 that collectively control the gain of amplifier module 104, and thus the power levels of output signals 118. As a power level of receive signal 114 varies, AGC module 106 adjusts the gain of amplifier module 104 so as to maintain the individual power levels of amplified signals 118 at substantially constant respective power levels.

Figure 2:
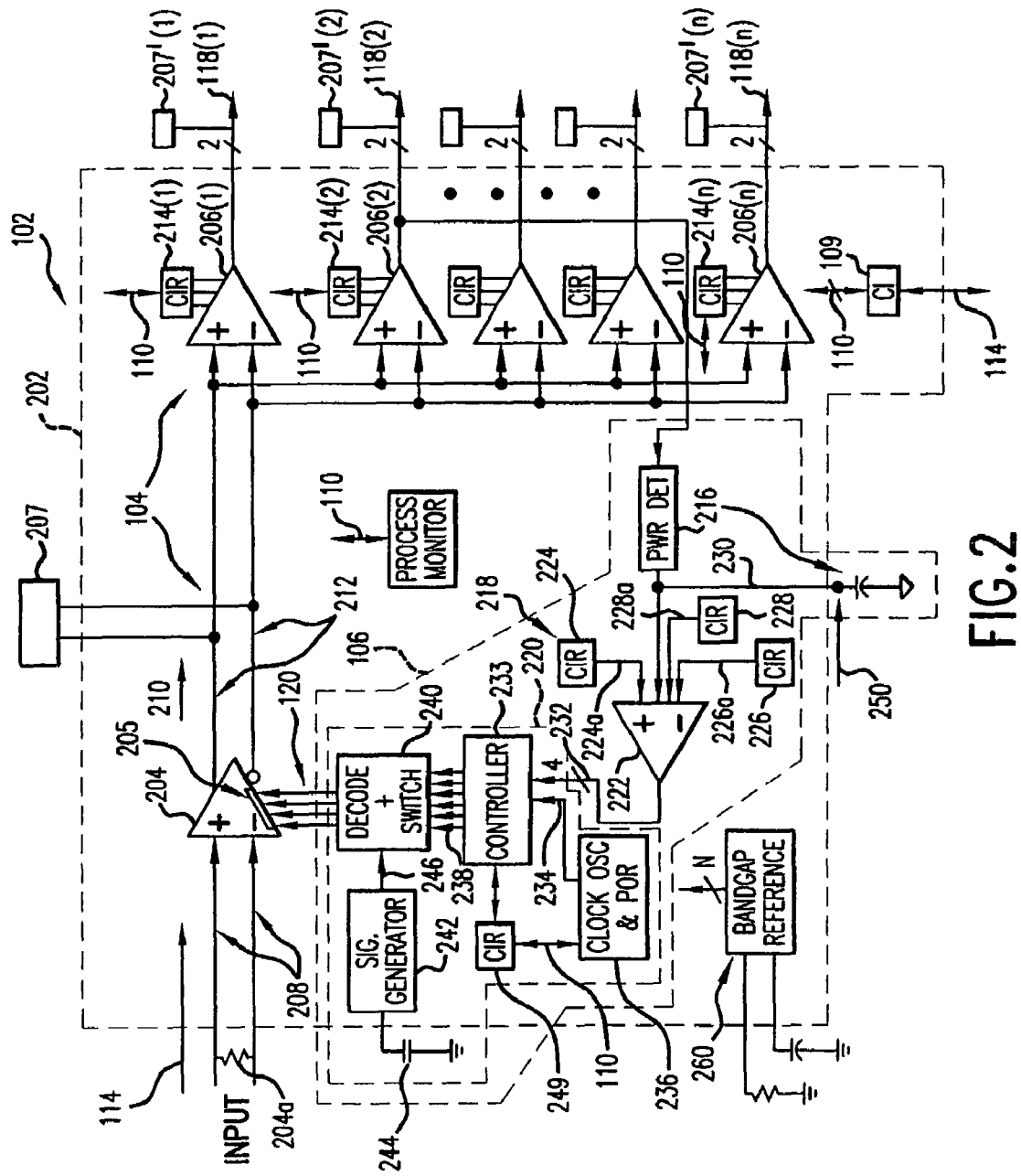
FIG. 2 is a block diagram of an example arrangement of the VGA assembly of FIG. 1.

FIG. 2 is a block diagram of an example arrangement of amplifier assembly 102, expanding on FIG. 1. Amplifier assembly 102 includes various circuit elements constructed on an integrated circuit (IC) substrate or chip 202, depicted in dashed-line. Such on-chip circuit elements are depicted within the dashed-line 202. Amplifier assembly 102 also includes various circuit elements external to IC substrate 202, depicted outside of the dashed-line 202.

Amplifier module 104 includes a first stage amplifier 204 followed by a plurality of, for example, five, parallel second stage amplifiers 206 for generating corresponding, separate parallel amplified signals 118. In an exemplary arrangement, first stage amplifier 204 is a VGA including an array of variable gain stages arranged in parallel with each other, each having an individual gain controlled responsive to a corresponding one of gain control signals 120.

In the arrangement of FIG. 2, VGA 204 is a differential amplifier, including differential inputs and differential outputs. A pair of differential signal lines 208 carry receive signal 114 to the differential inputs of VGA 204. Amplifier assembly 102 includes a resistor 204a coupled between input lines 208, external to IC chip 202. Together, resistor 204a and input attenuation of VGA 204 (not shown in FIG. 2, but discussed below), set an input impedance of amplifier assembly 102. VGA 204 includes one or more gain control inputs 205 for receiving corresponding gain control signals 120. In an arrangement, gain control signals 120 include bias or control currents. In an alternative arrangement, gain control signals include bias or control voltages.

VGA 204 amplifies receive signal 114 according to a gain of the VGA set by gain control signals 120, and produces an intermediate amplified receive signal 210. A pair of differential signal lines 212, coupled between the differential output of VGA 204 and respective differential inputs of each of second stage amplifiers 206, carry amplified signal 210 to the second stage amplifiers. Thus, each of parallel amplifiers 206 is fed with signal energy from a common input, e.g., the output of VGA 204/lines 212. Also, a termination circuit or output load 207 (described below in connection with FIG. 7) couples output lines 212 to a power supply rail of amplifier assembly 102.

Each of second stage amplifiers 206 has a gain that is programmable through CI 109. Thus, each of second stage amplifiers 206 is also a VGA. Programmable gain registers 214, coupled to CI 109 and respective gain control inputs of second stage amplifiers 206, hold respective gain values that program the gains of the corresponding amplifiers 206. Each amplifier 206(i) further amplifies amplified receive signal 210 in accordance with its respective gain set by the programmable gain in corresponding gain register 214(i), to produce respective amplified signal 118(i). As depicted in FIG. 2, each amplifier 118(i) is a differential amplifier, and each amplified signal 118(i) is a differential signal. Termination circuits or output loads 207'(1)-207'(n) (where each of the loads 207' is similar to load 207) couple respective outputs of amplifiers 206(1)-206(n) to a power supply rail of amplifier assembly 102. The output of each second stage amplifiers 206(i) is configured for driving its own load, for example, an individual tuner coupled to the output. Thus, amplifier assembly 102 is configured to drive multiple loads (such as tuners) in parallel.

In an arrangement, a first sub-plurality of second stage amplifiers 206 (for example, outside amplifiers 206(1) and 206(n)) have a common gain, that is, a programmed first gain, and a second sub-plurality of second stage amplifiers 206 (for example, inner amplifiers 206(2) through 206(n−1)) have a common second gain, that is, a programmed second gain. In this arrangement, the second gain is less than the first gain. For example, a ratio of the programmed first gain to the program second gain may be in a range of ratios of between 1:1 to 2:1.

Amplifier assembly 102 also includes AGC control circuitry or module 106 coupled between the output of second stage amplifier 206(2) and gain control inputs 205 of VGA 204. In an alternative arrangement, ACG module 106 is coupled between the output of VGA 204 (e.g., to lines 212) and gain control inputs 205. AGC control circuitry 106 includes, in series, a power detector 216, a comparator module 218, and an AGC controller module 220.

Power detector 216 detects a power level of output signal 206(2), and provides a detected power indicator 230, that is, a power level signal 230, to comparator module 218. Power detector 216 detects the combined power of all of the frequency channels in output signal 206(2) (which are the frequency channels in input signal 114). Therefore, power level signal 230 is representative of this combined power. Comparator module 218 includes a tri-level AGC window comparator 222, an upper threshold register 224, a lower threshold register 226, and a middle or target threshold register 228. Threshold registers 224, 226 and 228 provide respective upper (high), lower (low) and target power thresholds 224a, 226a and 228a to respective comparison inputs of comparator 222. Thresholds 224a-228a may be programmed through CI 109. Target threshold 228a may be half-way between thresholds 224a and 226a, closer to threshold 226a, or closer to threshold 224a, as desired.

Comparator 222 receives power level signal 230 at a comparison input of the comparator. Comparator 222 compares power level signal 230 to thresholds 224a, 226a and 228a, to produce a comparison result signal 232. Comparison result signal 232 indicates where the detected power of signal 118(2) (that is, power level signal 230) is in relation to thresholds 224a-228a. Together, upper threshold 224a and lower threshold 226a define an AGC window.

Controller module 220 includes a controller 233 that receives comparison result signal 232 and a clock 234 generated by a clock generator 236. Controller 233 generates a set of control signals 238 responsive to comparison result 232, and provides the control signals to a decoder and switch matrix 240 (also referred to as switch matrix 240). A signal generator 242, including an off-chip capacitor 244, generates a set of ramp and reference signals 246, and provides the ramp and reference signals to decoder and switch matrix 240. Decoder and switch matrix 240 generates gain control signals 120 in response to signals 246 and control signals 238.

CI 109 can assert control over, and collect status information from, controller module 220, through control interface registers 249. For example, CI 109 can command clock generator 236 to either start or stop generating clock 234. CI 109 can access status information in controller 233 indicative of a present gain setting of VGA 204. CI 109 can command controller 233 to set the gain of VGA 204 to any desired gain value. In normal AGC operation, controller module 220 adjusts the gain of VGA 204 responsive to comparison result 232. However, CI 109 can command controller 233 to hold the gain of VGA 204 fixed at a desired gain value, that is, controller 233 can be commanded to be non-responsive to comparison result signal 232. Essentially, this disables AGC operation in amplifier assembly 102. Since the gains of VGA 204 and second-stage parallel amplifiers 206 may be controlled through CI 109, an alternative arrangement of the amplifier assembly omits AGC module 106. In such an arrangement, the gain of the VGA module is controlled exclusively by CI 109.

In yet another mode of gain control operation, the output of power detector 216 can be turned off, and an external control voltage 250 can be substituted for the output of power detector 216. In other words, external control voltage 250 replaces signal 230.

In an arrangement, clock generator 236 is a relaxation oscillator based on alternately charging an on-chip capacitor (not shown in FIG. 2) with a reference current Iref and discharging the capacitor with a current 2Iref. This action produces a 50% duty-cycle triangle wave on a terminal of the capacitor. The control signals for the charge/discharge action are actually the clock output square wave.

The frequency of clock 234 can be tuned by changing the charge/discharge current to the capacitor. An example frequency tuning range is approximately 1.25 kHz to 80 kHz. An additional frequency tuning factor of 2× can be obtained by either reducing the on-chip capacitor in half, or making the capacitor 2× larger.

Oscillator 236 also includes a synchronous reset capability which does not produce glitches (i.e., undesired narrow pulse width outputs) on clock 234 when a RESET signal from CI 109 is asserted (e.g., set to a logic "1"). Likewise, when the RESET signal is set to logic "0," no glitch occurs. This is performed by logic circuitry within oscillator 236. This no-glitch action insures that the last-held-state of controller 233, when controller 233 is implemented as a stage machine, is maintained at reset and seamlessly restarted when reset is finished. The purpose of this feature is to allow for clock-free operation of the state machine (e.g., controller 233), except when checking for gain corrections via an external controller (e.g., controller 112). This was done in case relaxation oscillator 236 produces spurious signals on its output 234.

Amplifier assembly 102 also includes process monitor 108. In response to commands issued over CI bus 110, process monitor 108 selectively couples various ones of its process monitor outputs to the CI bus 110.

Amplifier assembly 102 also includes a bandgap voltage reference circuit 260. The bandgap voltage reference circuit 260 produces multiple voltages, including a first fixed voltage that does not vary with temperature, power supply voltage VDD or process variations. An example fixed voltage is approximately 1.2 Volts (V). Circuit 260 also produces a second voltage that increases proportional to absolute temperature (PTAT), but does not change with VDD or process variations.

Circuit 260 may produce bias currents based on the fixed and PTAT voltages. For example, the fixed voltage is applied across various resistors (both on- and off-chip 202) to create correspondingly fixed bias currents used by various sub-circuits within the IC chip. In general, the bias currents on the order of 200 uA are sent to each sub-circuit. Each sub-circuit then mirrors the currents, sometimes at fixed ratios (either up or down) to get the current(s) needed in each sub-circuit.

Likewise, the PTAT voltage is applied across various resistors (both on- and off-chip 202) to create PTAT bias currents used by various sub-circuits within the chip. The PTAT currents would increase at temperature increases.

A substantial portion of the circuits of amplifier assembly 102 are constructed on IC chip 202. However, input load resistor 204a, capacitor 244, and output load circuit 207 are external to IC chip 202. A general advantage of using such external or off-chip components is that relatively cheaper off-chip components have relatively more accurate parameter values (e.g., resistance, capacitance, inductance, and so on) as compared to corresponding internal or on-chip components. For example, low-cost off-chip components typically have 5% tolerances for resistors and 10% tolerances for capacitors and inductors. Even tighter tolerances can be achieved for slightly more expensive off-chip components.

In alternative arrangements of the present invention, input resistor 204a is on-chip. In yet another arrangement, output load circuit 207 is on-chip. Similarly, capacitor 244 may be provided on-chip. The parameter accuracy of the on-chip components in such arrangements may be achieved in a variety of ways. For example, switched resistor banks with calibration routines may be used to select a best-valued on-chip resistor among multiple resistors, and so on. In the case of an on-chip version of external capacitor 244, which is a large capacitance capacitor, capacitor multipliers may be used.

In another alternative arrangement of amplifier assembly 102, parallel second-stage amplifiers 206 are omitted whereby the output of VGA 204 drives subsequent processing stages.

II. VGA

Figure 3:
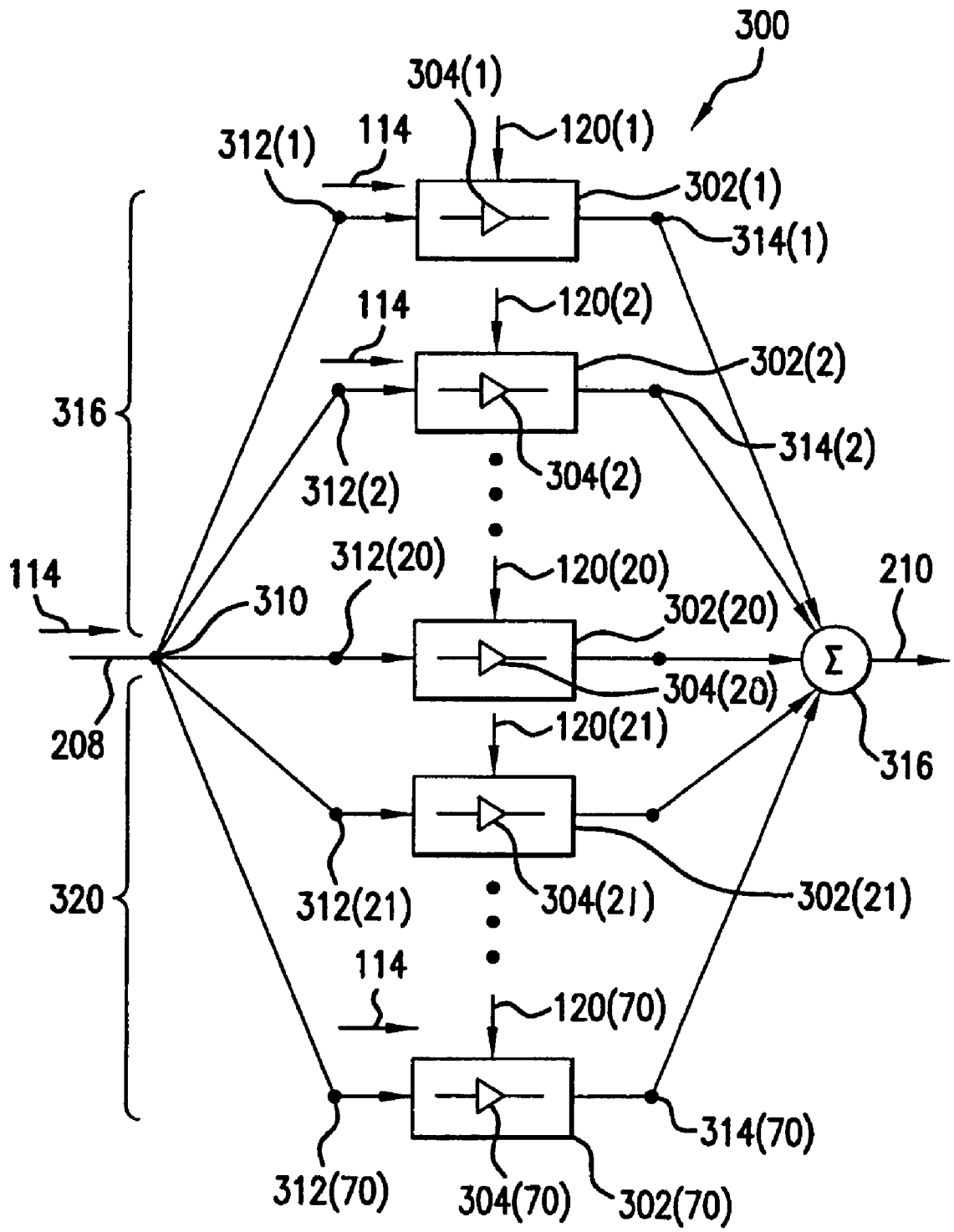
FIG. 3 is a block diagram of an example arrangement of a VGA, including an array of parallel gain stages, for use in the VGA assembly of FIG. 2.

FIG. 3 is a block diagram of an example arrangement 300 of VGA 204. In the example arrangement depicted in FIG. 3, VGA 204 includes a plurality of individual gain stages 302 arranged in parallel with each other. Each gain stage 302(i) receives a corresponding gain control signal 120(i). Each gain stage 302(i) includes a variable gain amplifier 304(i) having a gain controlled responsive to the corresponding gain control signal 120(i). In the example arrangement of FIG. 3, VGA 204 includes an array of seventy (70) variable gain stages 302, however, any number of gain stages from 1-to-n may be used. If only one gain stage is used, then AGC module 106 generates only one corresponding gain control signal 120(i).

VGA 204 includes an input node 310 coupled to differential signal lines 208. Gain stages 302 have their respective inputs 312 coupled to input node 310. Similarly, their respective outputs 314 are coupled to an output summing node 316 that combines together the respective gain stage outputs. Summing node 316 may be a wire-OR, for example, or any other circuit that combines together the gain stage outputs. Summing node 316 may include multiple sub-combining nodes for combining subsets of the outputs of gain stages 302. In an arrangement, input node 310, each of the inputs 312 and outputs 314, each gain stage 302(i), and summing node 316 are differential. However, these elements are depicted as being single-ended in FIG. 3. In VGA 204, gain stages 302 are considered to be arranged in parallel for at least the reason that their respective inputs are coupled to common input node 310, and thus, all of the gain stages are fed, with signal energy, from the common input node. Furthermore, the respective outputs of the gain stages are combined together at summing node 316.

In operation, each gain stage 302(i) amplifies receive signal 114 in accordance with its individual gain (g(i)) set by corresponding gain control signal 120(i) to produce a corresponding amplified receive signal presented at its output 314(i). Summing node 316 combines together all of these individual amplified signals to produce composite or aggregate amplified signal 210. Together, the array of parallel gain stages 302 establishes an aggregate gain of VGA 204 that is equal to a sum of all of the individual gains of gain stages 302. The aggregate gain is controlled in accordance with gain control signals 120.

In the arrangement depicted in FIG. 3, VGA 204 includes a first subset 316 of non-attenuated gain stages, including gain stages 302(1)-302(20). First subset gain stages 316 have substantially equal respective maximum gains. Amplifier array 204 also includes a second subset 320 of attenuated gain stages, including gain stages 302(21)-302(70). In an example arrangement, second subset gain stages 320 have progressively decreasing maximum gains in the direction 302(21)-302(70). In another example arrangement, VGA 204 includes a third subset of constant-attenuated gain stages, e.g., gain stages 304(71)-304(90), added to the bottom of the structure depicted in FIG. 3. All of the third subset of gain stages have fixed, constant attenuation.

Figure 4:
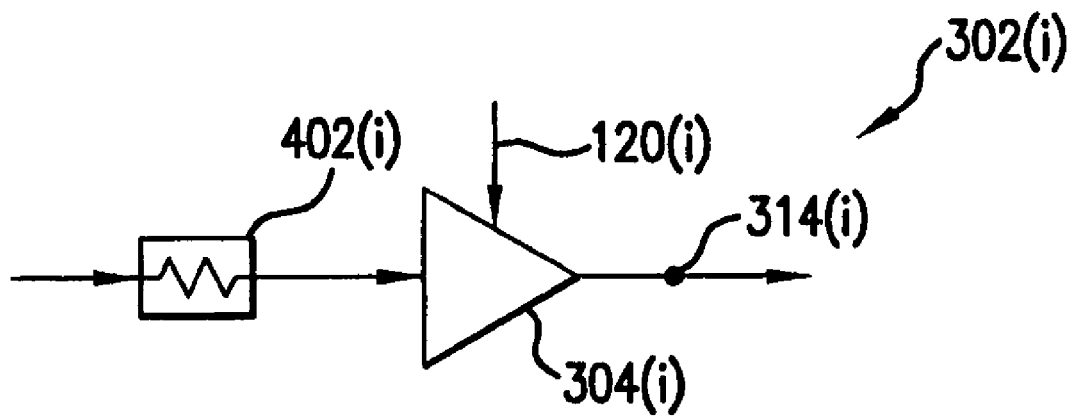
FIG. 4 is a block diagram of an example arrangement of an attenuated gain stage of the VGA of FIG. 3.

FIG. 4 is a block diagram of an example arrangement of an attenuated gain stage in the second subset or group of attenuated gains stages 320. Attenuated gain stage 302(i) includes an attenuator 402(i) followed by amplifier 304(i). Attenuator 402(i) may provide fixed or, alternatively, programmable attenuation.

Figure 4A:
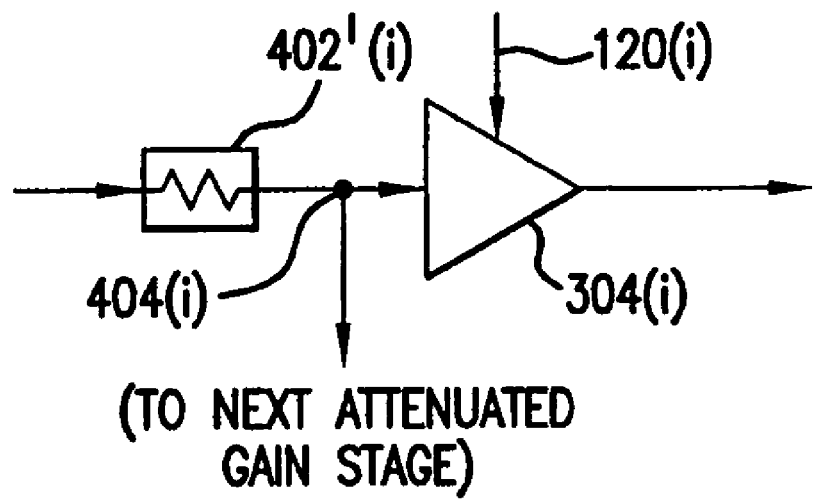
FIG. 4A is a block diagram of another example arrangement of a portion of an attenuated gain stage of the VGA of FIG. 2.

FIG. 4A is a block diagram of another example arrangement of an attenuated gain stage. In the arrangement of FIG. 4A, a tap-point or junction 404(i) between attenuator 402'(i) and amplifier 304(i) of attenuated gain stage 302(i) is coupled to a next attenuated gain stage 302(i+1), and so on. The attenuator reference numeral 402' includes the prime suffix (') to indicate that the attenuator is shared between gain stages. The use of the attenuated gain stage of FIG. 4A in VGA 204 leads to a another parallel arrangement of attenuated gain stages, as depicted in FIG. 4B.

Figure 4B:
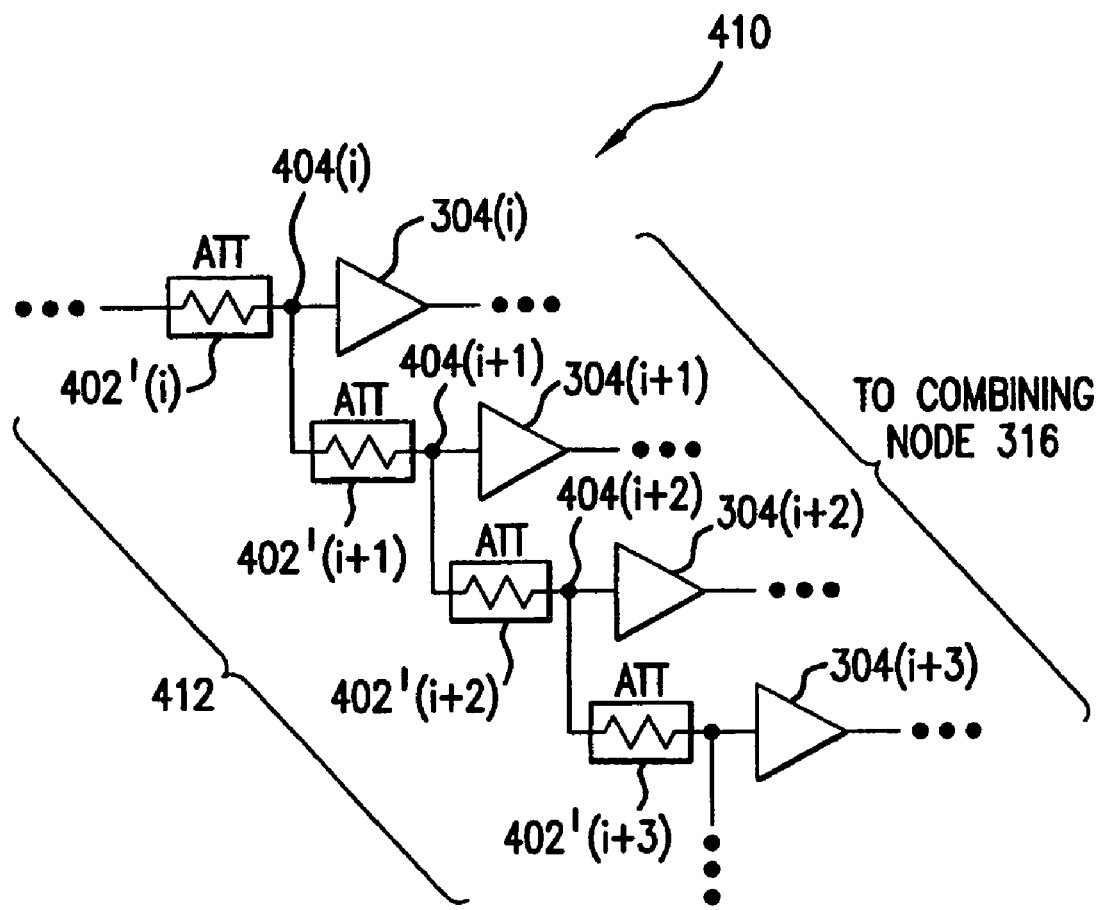
FIG. 4B is a block diagram of an arrangement of multiple attenuated gain stages, which is based on the gain stage arrangement of FIG. 4A.

FIG. 4B is a block diagram of such a parallel arrangement 410 of attenuated gain stages. In arrangement 410, the attenuated gain stages are cascaded in parallel with each other such that the attenuated gain stages share attenuators. Arrangement 410 includes an attenuation ladder 412 coupled between input node 310 (not shown in FIG. 4B) and the inputs of the amplifiers of the attenuated gain stages. Attenuation ladder 412 includes a string of series connected attenuators 402'. Successive amplifiers 304(i), 304(i+1), and so on, have their respective inputs fed from corresponding successive taps 404(i), 404(i+1), and so on, of attenuation ladder 412. That is, each attenuator 402'(i) feeds both the input to amplifier 304(i) and also the input to attenuator 402'(i+1) of next gain stage 302(i+1), and so on. Thus, the successive taps are associated with increasing attenuation. In this arrangement, attenuated gain stage 302(i+1) includes attenuator 402'(i), attenuator 402'(i+1), and amplifier 304(i+1) connected in series with one another. Similarly, attenuated gain stage 302(i+2) includes attenuator 402'(i), attenuator 402'(i+1), attenuator 402'(i+2), and amplifier 304(i+2) connected in series with each other, and so on.

Figure 4C:
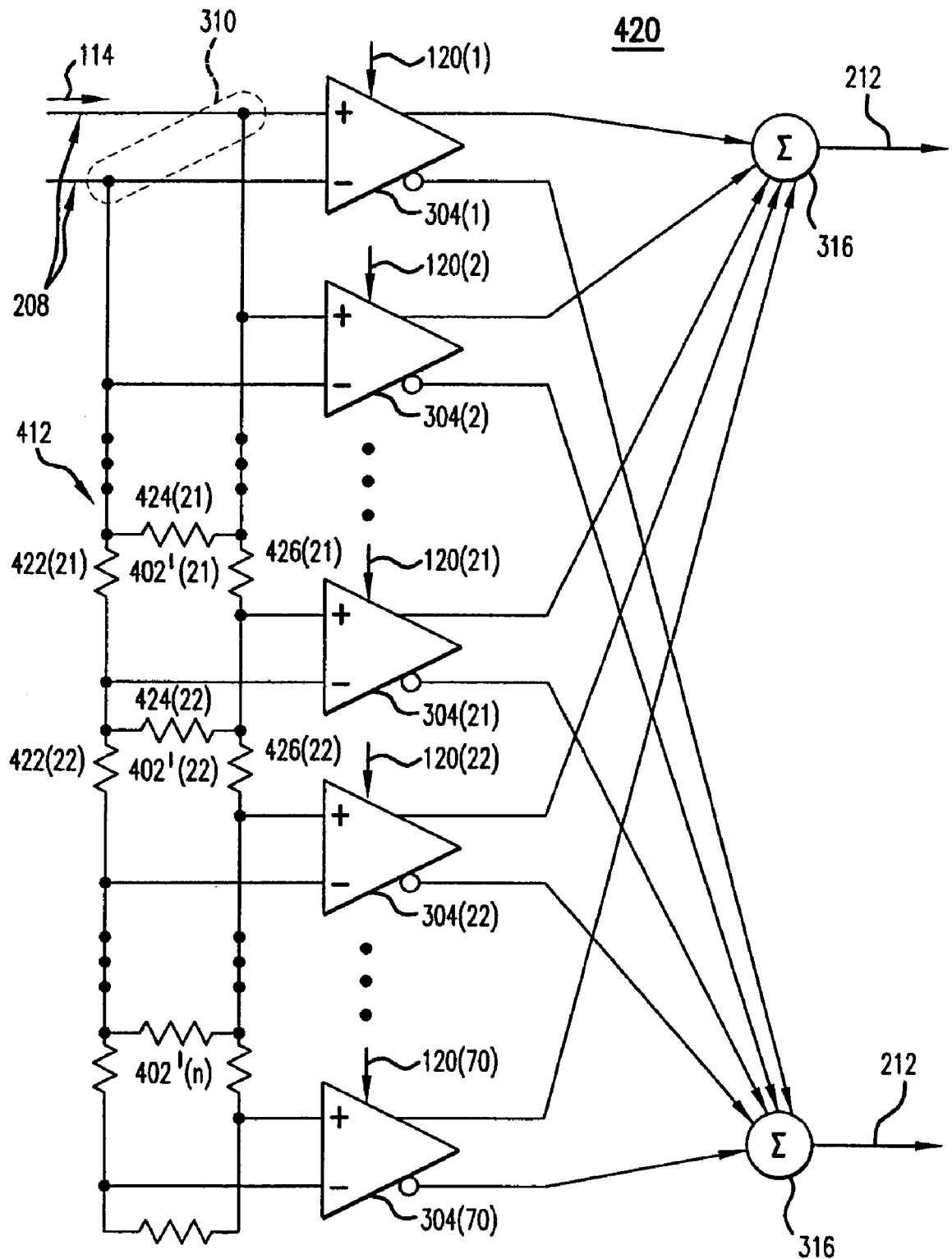
FIG. 4C is a block diagram of another example arrangement of the VGA of FIG. 2, using the attenuated gain stage arrangements of FIGS. 4A and 4B, and including differential components.

FIG. 4C is a block diagram of a differential arrangement 420 of VGA 204, using the attenuation ladder configuration described above in connection with FIG. 4B. In arrangement 420, input node 310, amplifiers 304, attenuators 402', and output combining node 316 are all differential. Attenuation ladder 412 includes cascaded attenuators 402'. Each attenuator 402'(i) includes resistors 422(i), 424(i) and 426(i) connected together as depicted in FIG. 4C. Together, external input resistor 204a and internal attenuators, 402' (for example, attenuation ladder 412) set or control the input impedance of amplifier assembly 102, that is, the impedance seen looking into the amplifier assembly along input lines 208.

Figure 5:
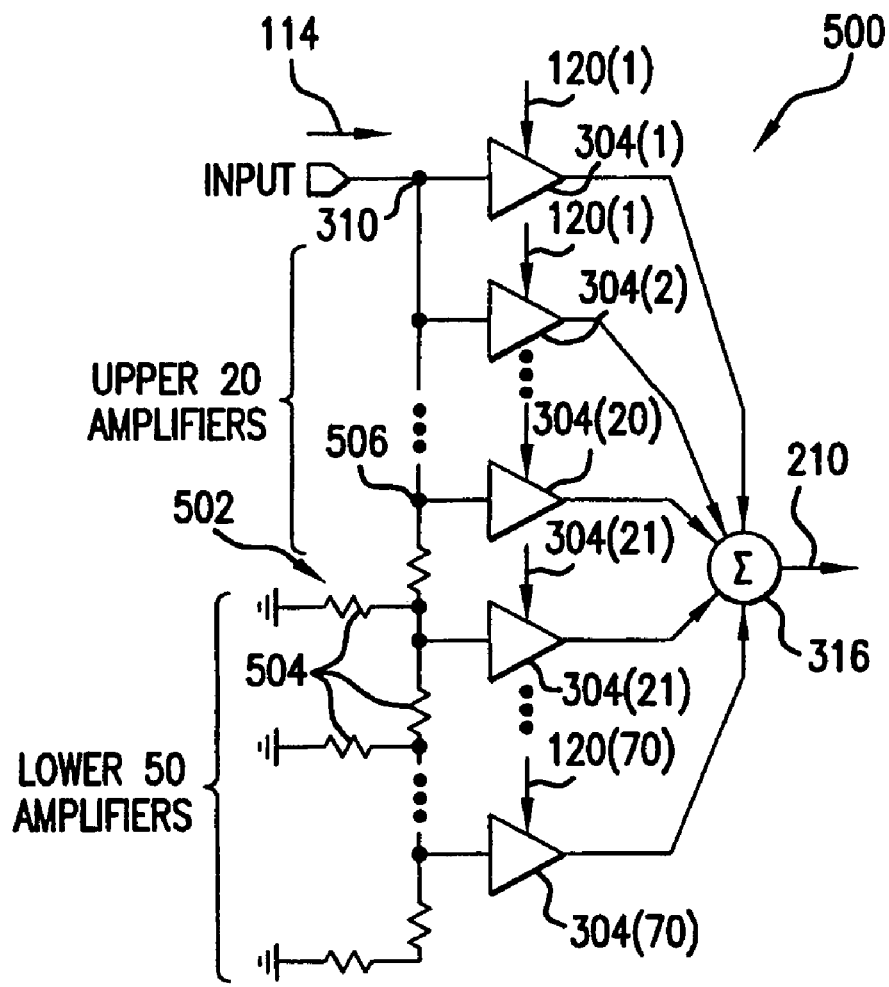
FIG. 5 is a block diagram of still another example arrangement of the VGA of FIG. 2, including single-ended components.

FIG. 5 is a block diagram of a single-ended (that is, non-differential) arrangement 500 of VGA 204. The amplifier arrangement of FIG. 5 includes a resistor ladder 502, including resistors 504, coupled between input node 310, specifically between node 506 and ground. Amplifiers 304(21)-304 (70) in the attenuated gain stages have their respective inputs tied to corresponding successive taps of resistor ladder 502. In an alternative arrangement, the individual taps of resistor ladder 502 are coupled to outputs of amplifiers 320, instead of to the inputs of the amplifiers.

Figure 6:
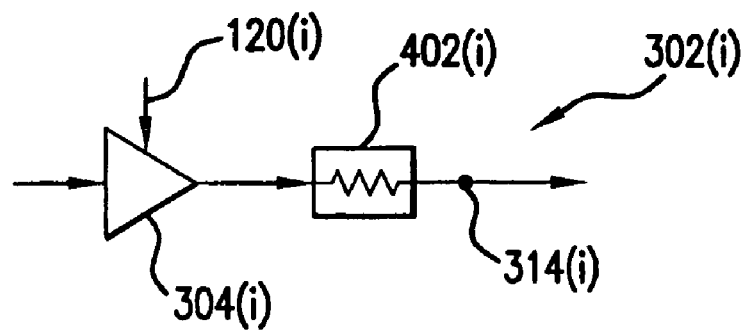
FIG. 6 is a block diagram of another example arrangement of an attenuated gain stage.

FIG. 6 is a block diagram of another example arrangement of attenuated gain stage 302(i). As depicted in FIG. 6, attenuated gain stage 302(i) includes amplifier 304(i) followed by attenuator 402(i).

In still another arrangement of VGA 204, attenuators are omitted, so that the parallel attenuated gain stages are simply amplifiers (e.g., FETs) sized smaller than the amplifiers of the parallel non-attenuated gain stages. Since the gain of an amplifier is proportional to its size, the smaller amplifiers provide less gain. The attenuated gain stage amplifiers have progressively decreasing sizes, and therefore, progressively decreasing maximum gains.

In each of the arrangements of VGA 204 depicted in FIGS. 3, 4B, 4C and 5, all of the gain stages are considered to be arranged in parallel with each other for at least the reason that they are fed from a common input node. Also, their individual outputs are combined together to produce an aggregate output, e.g., amplified signal 210.

In still another arrangement of the VGA, the attenuated gain stages may be omitted. In such an arrangement, all of the parallel gain stages have substantially the same maximum gain.

Figure 7:
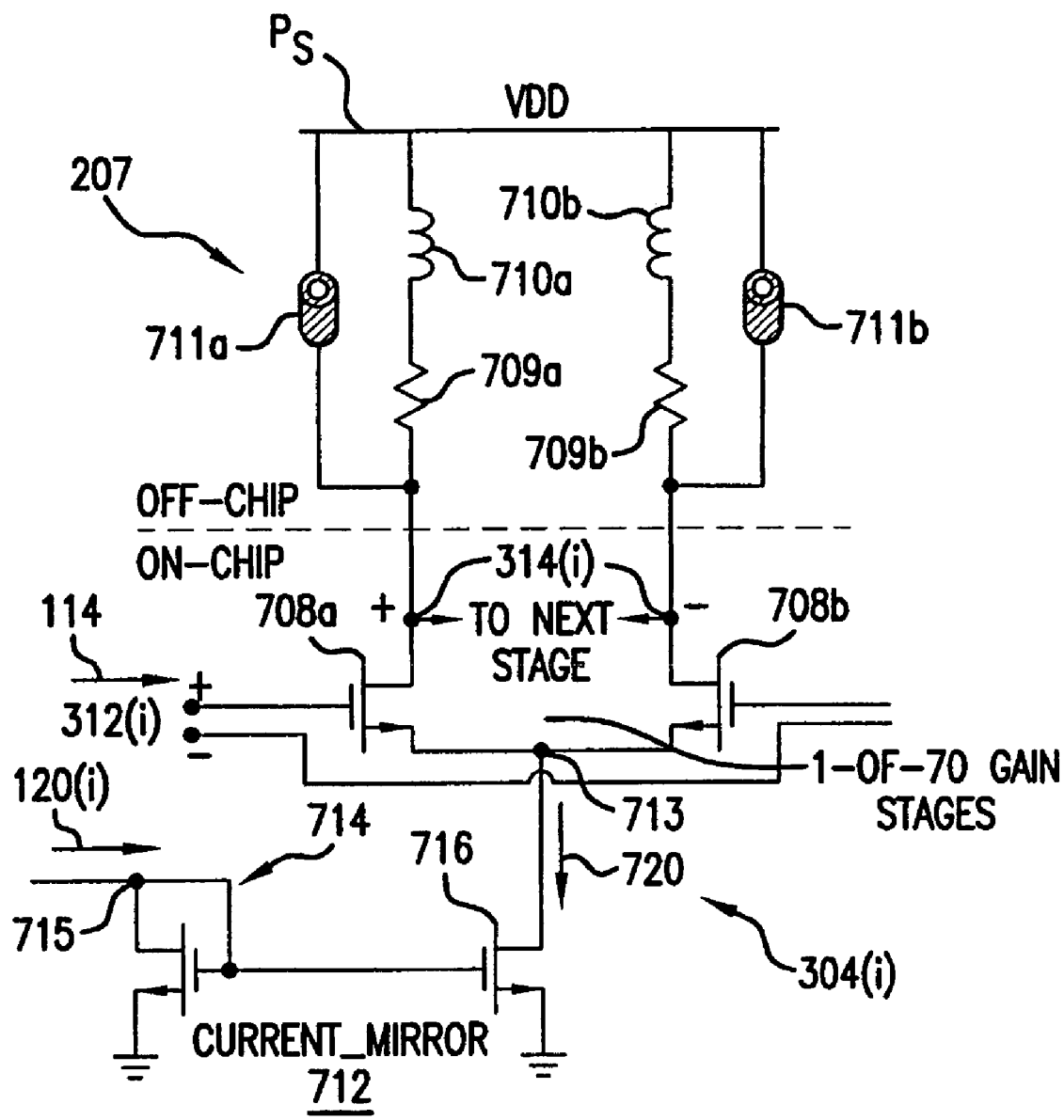
FIG. 7 is a circuit diagram of an example differential amplifier used in a differential gain stage of the VGA of FIG. 2.

FIG. 7 is a circuit diagram of an example differential gain stage amplifier 304(i) used in the present invention, for example, in amplifier array 204. As depicted in FIG. 7, a pair of differentially configured amplifier transistors 708a and 708b have their respective gate terminals connected to complimentary differential nodes of input 312(i). The drains of transistors 708a and 708b are coupled to respective complimentary sides of output 314(i). Termination circuit 207 (also referred to as an output load circuit, and mentioned above in connection with FIG. 2) couples the drains of transistors 708a and 708b (and sources of corresponding differential transistors in all of the other amplifiers 304) to a power supply rail $P_S$, at power supply voltage VDD, for example. Specifically, in termination circuit 207, the drain of transistor 708a is connected to power supply rail $P_S$ through series connected resistor 709a and inductor 710a, and a ferrite bead 711a connected in parallel with the series resistor and inductor. Ferrite bead 711a has the effect of a large value inductor in parallel with a large resistor. Also, the drain of transistor 708b is similarly coupled to rail $P_S$ through resistor 709b, inductor 710b, and ferrite bead 711b.

The respective source-drain paths of transistors 708a and 708b are connected together and to a current mirror 712, at a common terminal 713. Current mirror 712 includes a diode configured transistor 714 coupled to a gain control input terminal 715 (part of gain inputs 205) of amplifier 304(i), and also to a gate of a transistor 716, which has its source-drain path connected between terminal 713 and ground. Thus, transistor 716 operates as the tail current transistor, and thus as a current source, for differential transistors 708. In operation, gain control signal 120(i), applied to current mirror 712, controls a current 720 flowing through the source-drain path of tail transistor 716. The differential gain (g(i)) of amplifier 304(i) is controlled responsive to a magnitude of current 720. Thus, gain control signal 120(i) controls the gain (g(i)) of amplifier 304(i) and corresponding gain stage 302(i). In a typical arrangement, transistor 714 is a fraction, for example, one-eighth, the size of transistor 716. Thus, tail current 720 is a multiple, for example, eight times as large as, of control current 120(i).

Referring again to FIG. 2, each second stage amplifier 206(i) may include a differential amplifier that is similar to the amplifier depicted in FIG. 7. As mentioned above, each second stage amplifier 206(i) has its differential output coupled to respective termination circuit 207'(i). Also, each termination circuit 207'(i) is substantially the same as termination circuit 207 depicted in FIG. 7. However, the component values used in each circuit 207'(i) may differ from the component values used in the other circuits 207', and from the component values used in circuit 207.

Figure 8:
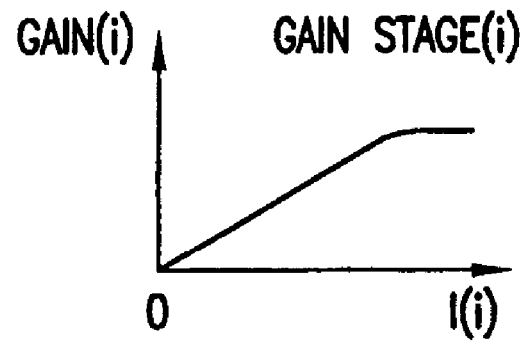
FIG. 8 is a gain response curve or transfer function for a gain stage of the VGA of FIG. 2.

FIG. 8 is a gain response curve for gain stage 302(i) and gain stage 304(i). That is, FIG. 8 is a plot of gain stage gain (g(i)) versus the amplitude of corresponding gain control signal 120(i). In the present invention, gain control signal 120(i) is a current I(i). A given gain control signal 120(i) can set the gain of corresponding gain stage 302(i) to a minimum gain (e.g., zero gain), a maximum respective gain for that gain stage, or may cause the gain to change between its minimum value (e.g., zero) and the maximum value.

In the present invention, a gain change between the minimum and maximum gain levels for a given gain stage 302(i) is achieved according to (that is, follows) a ramp function. That is, the gain changes (e.g., increases or decreases) gradually over a time interval. In accordance with the ramp function, the gain changes smoothly and continuously to avoid abrupt, discontinuous gain changes.

III. VGA Gain Change Operation—Overview

Figure 9:
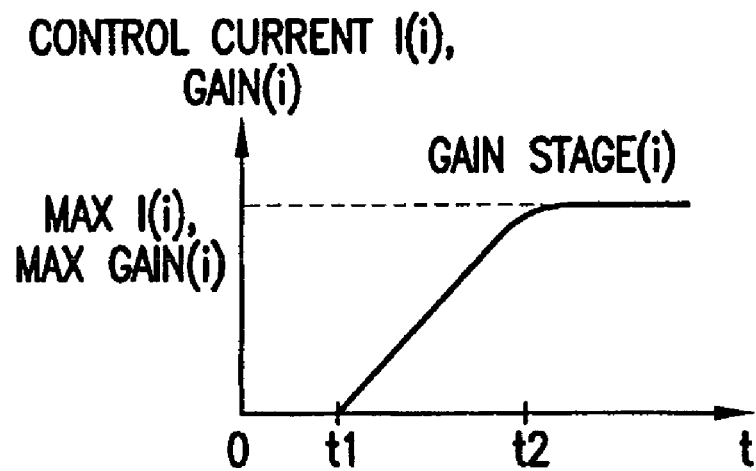
FIG. 9 is an illustration of an exemplary smooth and continuous ramp-shaped gain change (increase) over time for a gain stage of the VGA of FIG. 2.

FIG. 9 is an illustration of such a smooth and continuous ramp-shaped gain change for a given gain stage 302(i). Specifically, FIG. 9 is an example combined plot for (i) gain versus time, and correspondingly, (ii) gain control current I(i) versus time, for gain stage 302(i). In the plot of FIG. 9, gain stage 302(i) undergoes a gain change (i.e., increase) from zero gain at time t, to its respective maximum gain at time $t_2$ in response to gain control current I(i). The gain change is continuous, that is, does not have discrete gain level steps or jumps. Also, the gain change is smooth. For example, the slope of the gain change is continuous, and thus, does not exhibit discontinuities. The gain may increase monotonically over time, such as linearly or exponentially. However, the gain change may also include non-monotonic portions, as long as they are smooth and continuous.

Figure 10:
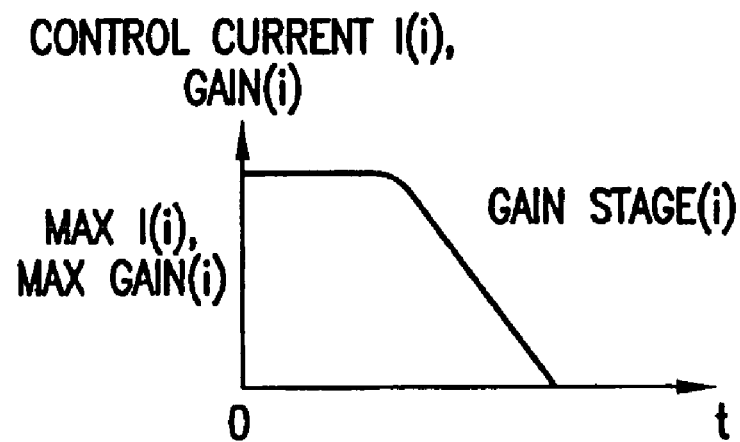
FIG. 10 is an illustration of an exemplary smooth and continuous ramp-shaped gain change (decrease) over time for a gain stage of the VGA of FIG. 2.

FIG. 10 is combined plot similar to FIG. 9, but for a decrease in gain. That is, FIG. 10 is an illustration of an exemplary smooth and continuous ramp-shaped gain change (decrease) over time for a gain stage 302(i) of the VGA of FIG. 3.

Figure 10A:
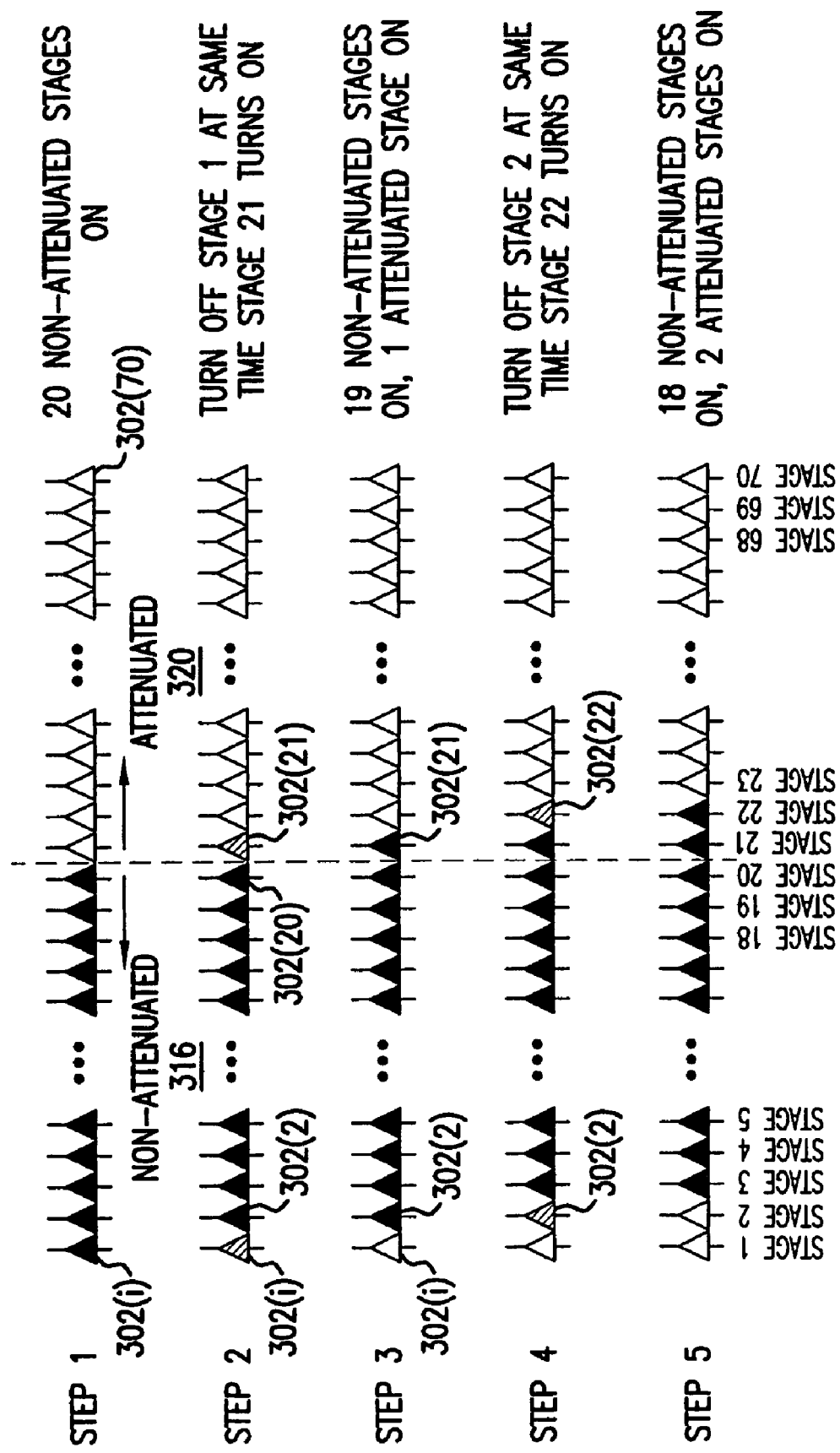
FIG. 10A is an illustrative example of how the aggregate gain of the VGA of FIG. 2 may be changed in steps in the present invention.

FIG. 10A is an illustrative example of how the aggregate gain of first stage amplifier 204, e.g., amplifier array 204, may be changed in the present invention. In this illustrative example, the aggregate gain of amplifier array 204 is decreased from a maximum aggregate gain to an intermediate aggregate gain. In FIG. 10A, each gain stage 302(i) is depicted as a triangle. Dark-shaded triangles depict gain stages that are fully ON, that is, operated at their respective maximum gains. In contrast, triangles that are not shaded (that is, un-shaded triangles) depict gain stages that are fully OFF, that is, gain stages set to zero gain. Triangles filled with cross-hatches indicate gain stages that are in the process of having their respective gains changed, for example, either increased or decreased. Also, the process of changing aggregate gain depicted in FIG. 10A proceeds from a first step "Step 1" depicted at the top of FIG. 10A, to a final step "Step 5" depicted at the bottom of the FIG. 10A.

Initially, in Step 1, the aggregate gain of amplifier array 204 is at a maximum aggregate gain level. In this state, all of non-attenuated gain stages 316 (i.e., gain stages 302(1)-302(20)) are set to or operating at their respective maximum gains. Concurrently, all of the attenuated gain stages 320 (i.e., gain stages 302(21)-302(70)) are set to or operated at zero gain. Thus, in Step 1, gain stages 302(1) through 302(20) represent first gain stages among the set of gain stages 302 that are set to their respective maximum gains. Similarly, gain stages 302(21) through 302(70) represent second gain stages of the gain stages 302 that are set to zero gain. Note here that the terms "first gain stages" and "second gain stages" refer to gain stages of VGA 204 only, and are not to be confused with "first stage amplifier 204" and "second stage amplifiers 206" discussed above in connection with FIG. 2, for example.

In Step 2, the gain of one of the first gain stages is decreased to zero gain according to a ramp function and the gain of one of the second gain stages is increased to its respective maximum gain according to the ramp function. More specifically, the gain of gain stage 302(1) is decreased to zero gain according to the ramp function and the gain of gain stage 302(21) is increased to its respective maximum gain according to the ramp function. The gain increase operation and the gain decrease operation may be performed concurrently, or alternatively, sequentially, that is one after the other.

After the gain changes of Step 2, the amplifier array 204 is configured as depicted in Step 3 of FIG. 10A. Namely, gain stages 302(2) through 302(21) are set to the respective maximum gains (and thus, represent a new set of first gain stages that are fully ON), while gain stages 302(1) and 302(22)-302(70) are set to zero gain (and thus, represent a new set of second gain stages that are fully OFF).

In step 4, a further decrease in aggregate gain is achieved by decreasing the gain of gain stage 302(2) to zero and increasing the gain of gain stage 302(22) to its respective maximum. These gain changes may be performed concurrently or sequentially.

After the gain change of Step 4, amplifier array 204 is configured as depicted in Step 5. The aggregate gain of amplifier array 204 in Step 5 is less than the aggregate gain of amplifier array 204 in Step 1. This is because the sum of the maximum gains of the gain stages turned ON in Step 5 (i.e., gain stages 302(3)-302(22)) is less than the sum of the maximum gains of the gain stages turned ON in Step 1 (i.e., gain stages 302(1)-302(20)). State otherwise, the sum of the maximum gains of gain stages 302(20)-302(21) is less than the sum of the maximum gains of gain stages 302(1)-302(2).

During the gain change process depicted in FIG. 10A, a contiguous set of gain stages (e.g., twenty gain stages) are maintained in their fully ON states. This contiguous set of ON gain stages is dynamic, and "slides" to the right across the full set of gain stages 302 depicted in FIG. 10A. If the aggregate gain is further decreased to a point where the lower twenty attenuated gain stages, e.g., gain stages 302(51)-302(70)), are ON, then any further decrease in gain is achieved by sequentially turning OFF gain stage 302(51), then gain stage 302(52), and so on until none of the gain stages remain ON.

The process for increasing aggregate gain is essentially opposite from the process for decreasing aggregate gain. That is, higher numbered gain stages are sequentially turned fully ON, while lower numbered gain stages are sequentially turned fully OFF. In this case, the contiguous set of ON gain stages would slide to the left in FIG. 10A as the aggregate gain is increased.

Figure 10B:
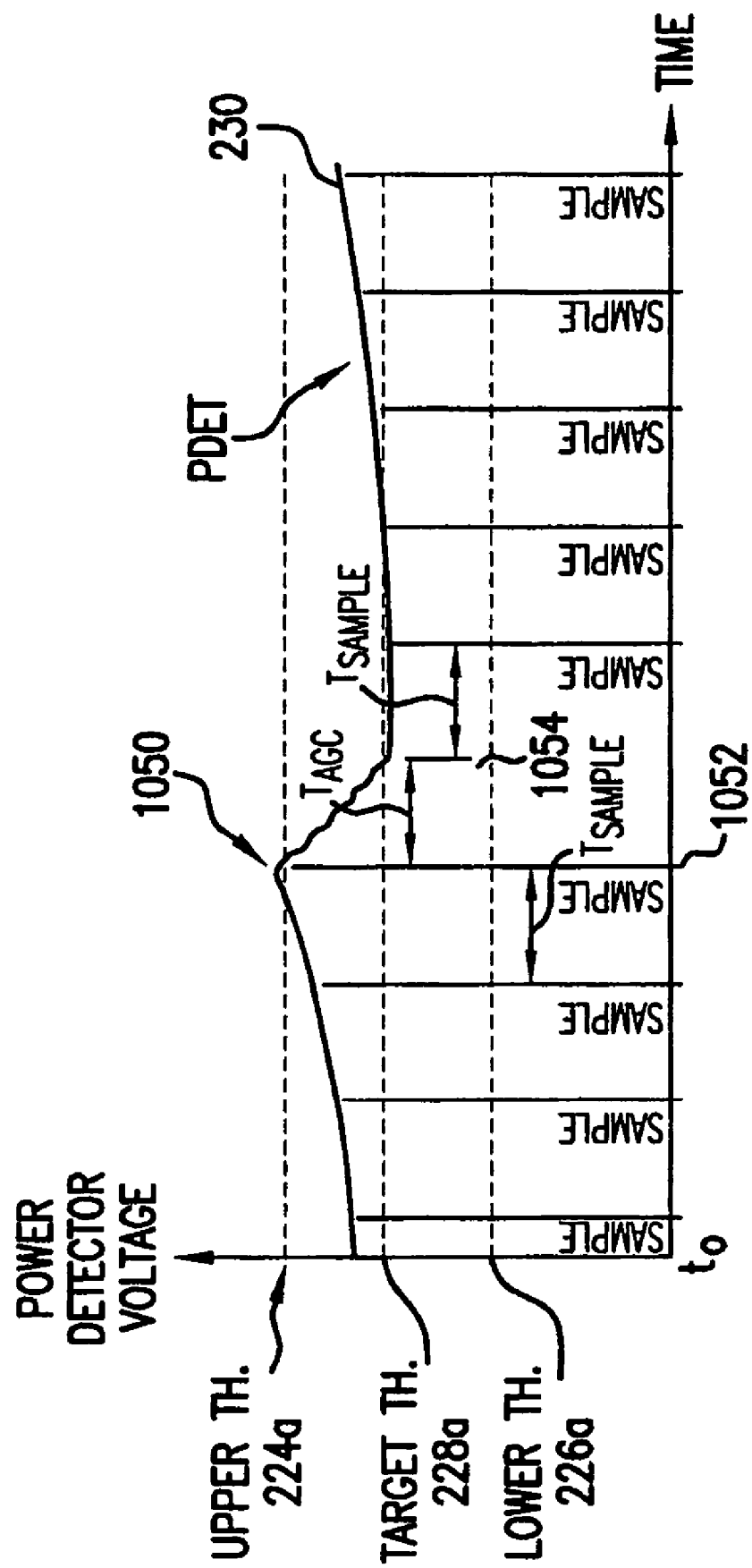
FIG. 10B is an example plot of an AGC power control signal versus time for the amplifier assembly of FIG. 2, corresponding to an example receive signal scenario.

FIG. 10B is an example plot of power control signal 230 versus time corresponding to an example receive signal scenario. The example plot of FIG. 10B serves as a useful illustration of the operation of VGA 204 and AGC module 106 with respect to power level signal 230 and thresholds 224a-228a. An initial assumption is that at a time to, the power of receive signal 114, the aggregate gain of VGA 204, and the resulting power of amplified receive signal 118(2) are such that power level signal 230 is between upper threshold 224a and lower threshold 226a, as depicted in FIG. 10B. It is also assumed that at periodic time intervals $t_{sample}$, controller module 220 (more specifically, controller 233) polls or "samples" comparison result signal 232.

Beginning at a time to, a slow increase in the power of receive signal 114 causes a correspondingly slow increase in amplified signals 210 and 118(2), and power detector level signal 230. AGC module 106 maintains the gain of amplifier 204 at a fixed level as power signal 230 rises. Eventually, power signal 230 rises to a level that is greater than upper threshold 224a, as indicated at 1050 in FIG. 10B. At a next sample time 1052, controller module 220 polls comparison result signal 232, which indicates the over-threshold condition at 1050. In response to this over-threshold condition, controller module 220 generates gain control signals 120 to decrease the gain of VGA 204 continuously and smoothly, and correspondingly, power level signal 230, until the power level signal passes below target threshold 228a.

At a sample time 1054, controller module 220 becomes informed that power level signal 230 has crossed, e.g., dropped below, target threshold 228a. In response to this condition, controller module 220 generates gain control signals 120 such that the gain of amplifier 204 remains fixed. That is, controller module 220 stops changing the gain amplifier 204 because power signal 230 is at or near the target threshold 228a. Controller module 220 will cause the gain of amplifier 204 to remain at this fixed level until power level signal 230 again becomes either too high (i.e., above upper threshold 224a) or too low (i.e., below lower threshold 226a). Controller module 220 causes the gain of VGA 204 to decrease in a smooth and continuous manner between points 1050 and 1054. This results in the smooth and continuous downward slope of power level signal 230 depicted in FIG. 10B. In an example arrangement, controller module 220 causes the gain of VGA 204 to decrease according to the process discussed above in connection with FIG. 10A, that is, by sequentially turning OFF and ON gain stages in the amplifier array 204. The smooth and continuous gain change arrangement produces a correspondingly smooth and continuous change in the power levels of signals 210 and 118.

The smooth and continuous change of power level signal 230 depicted in FIG. 10B includes small stair-steps or "wiggles" having sloped falling edges. This results from smooth and continuous gain changes having corresponding stair-steps. These stair-steps result from pauses between incremental gain changes. For example, with reference again to FIG. 10A, gain is changed in the following manner. In Step 2, the gain of VGA 204 is decreased an incremental amount, smoothly and continuously according to a ramp function. Then, in step 3, the gain of VGA 204 remains constant for a short period of time, that is, the gain remains level. Then, in Step 4, the gain, of VGA 204 is decreased again an incremental amount, smoothly and continuously according to a ramp function. Steps 2, 3 and 4 repeat until power level signal 230 crosses target threshold 228a. The pause between successive incremental gain changes is discussed below in connection with FIG. 20.

IV. Controller Module, Detector Module, and Comparator

Figure 11:
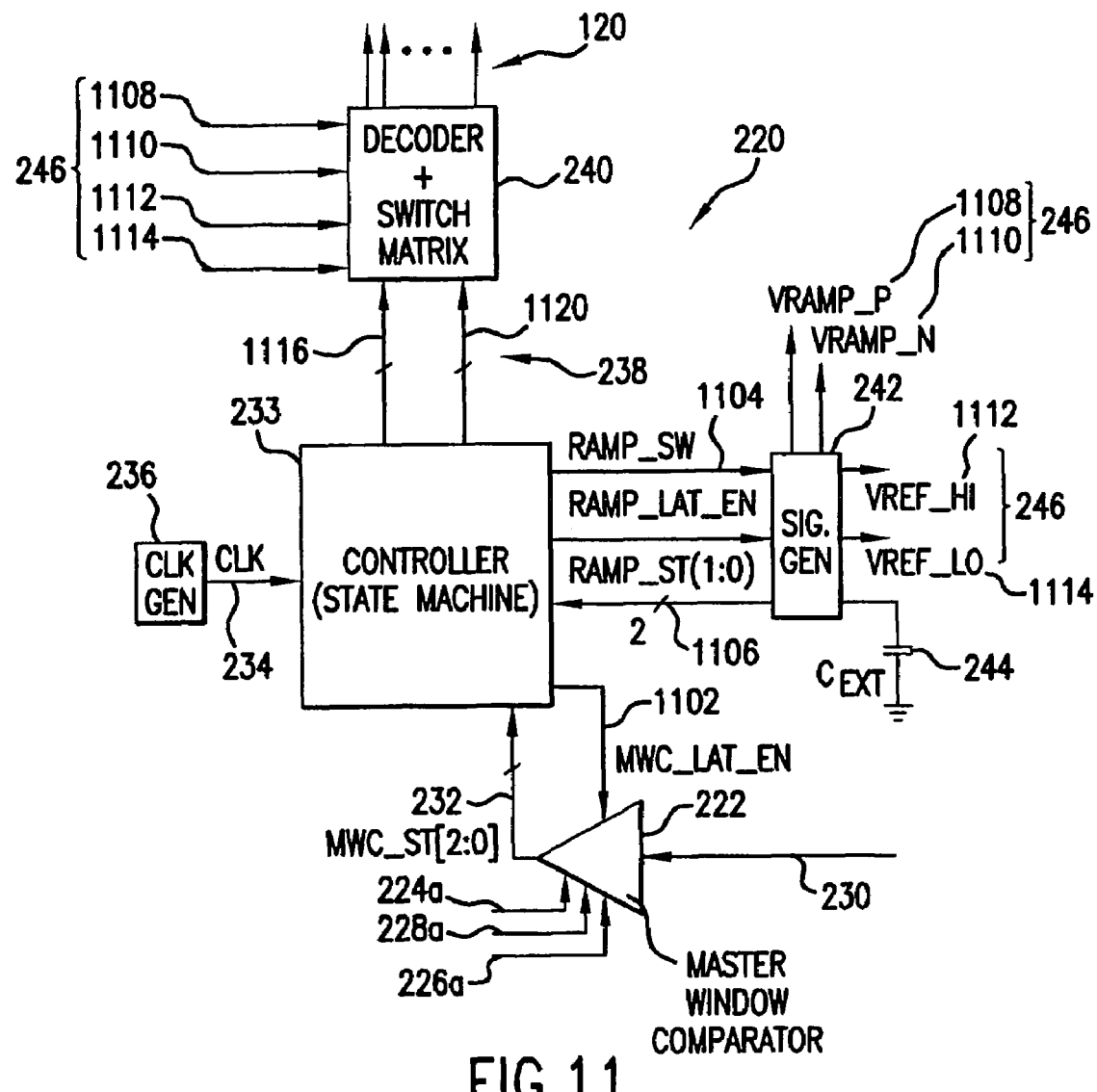
FIG. 11 is a block diagram expanding on a controller module and a tri-level AGC window comparator of the amplifier assembly of FIG. 2, according to an embodiment of the present invention.

FIG. 11 is a block diagram expanding on controller module 220 and portions of comparator module 218, discussed above in connection with FIG. 2. Depicted in FIG. 11 are various low-level control signals not specifically depicted in FIG. 2. As mentioned above, controller module 220 generates gain control signals 120 responsive to comparison result signal 232. Controller 233 of controller module 220 provides a comparator control signal 1102 to comparator 222. At periodic time intervals, controller 233 asserts comparator control signal 1102, thus causing comparator 222 to produce comparison result signal 232 at these time intervals. Thereafter, controller 233 polls comparison result signal 232 to determine whether the gain of VGA 204 should be either changed or maintained at a current or present level, as mentioned above in connection with FIG. 10B. In the present invention, the periodic time intervals (e.g., the time between successive polling operations) are programmable in duration, and should correspond to the rate at which the power level of input signal 114 is expected to vary. Exemplary time intervals may be between 1 millisecond and 1 minute, or even longer. More typical time intervals are in the range of 1-10 milliseconds. In an arrangement, controller 233 is a state-machine based controller clocked by clock 234. However, controller 233 may be any digital or analog controller.

Controller 233 also provides signal generator control signals 1104 to signal generator 242, and receives a ramp status signal 1106 from the signal generator. Signal generator 242 includes a ramp generator and a reference signal generator (not shown separately in FIG. 11). The ramp generator generates complimentary ramp signals 1108 (VRAM_P) and 1110 (VRAM_N) on command, that is, in response to a ramp trigger signal in control signals 1104. The reference signal generator generates reference signals 1112 (VREF_HI) and 1114 (VREF_LO) having complimentary fixed signal values or amplitudes. For example, signal 1112 is a fixed high voltage, while signal 1114 is a fixed relatively low voltage. Signals 1108-1114 are provided to decoder and switch matrix 240.

Controller 233 also generates control signals 238 for controlling decoder and switch matrix 240. Control signals 238 include an address pointer 1116 indicating which of the gain stages 302 of VGA 204 should be fully ON, that is, operating at their respective maximum gains, at any given time. Controller 233 also generates a set of digital control signals 1120 for controlling various functions of decoder and switch matrix 240. For example, signals 1120 indicate whether the gain of VGA 204 should be increased or decreased, and when such a change should occur. Responsive to (i) control signals 1116 and 1120, (ii) ramp signals 1108 and 1110 when generated, and (iii) reference signals 1112 and 1114, decoder and switch matrix 240 generates gain control signals 120 as appropriate to either change (i.e. increase or decrease) or maintain at a constant level the gain of VGA 204.

Figure 12:
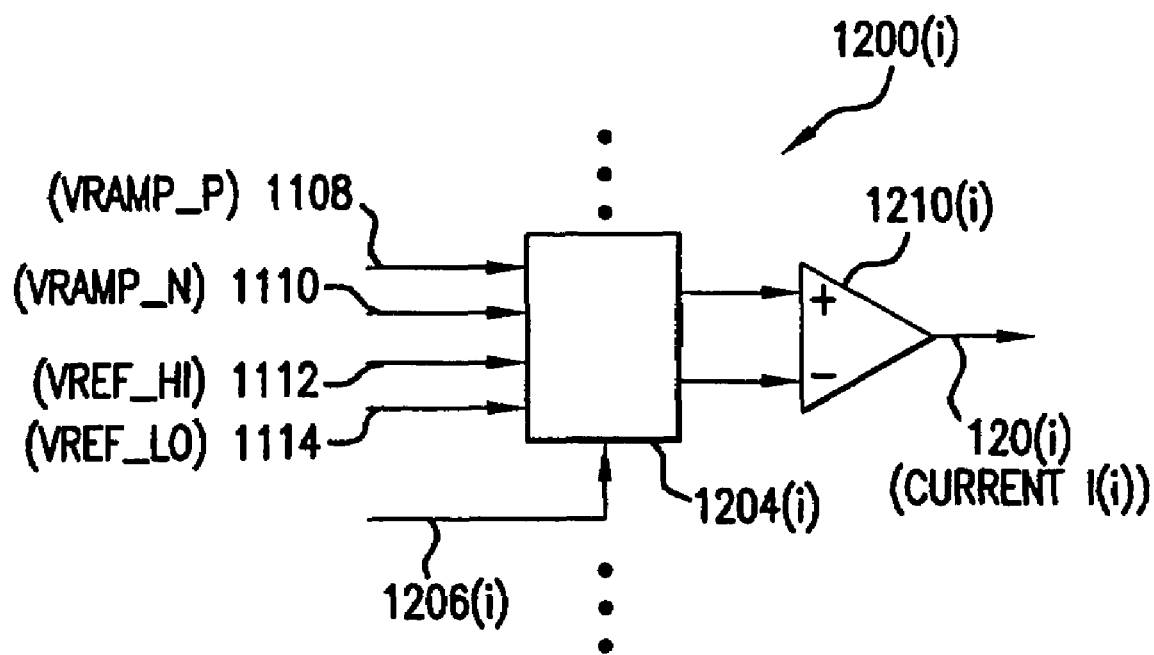
FIG. 12 is a block diagram of an example switch within a decoder and switch matrix of the amplifier assembly of FIG. 2.

FIG. 12 is a block diagram of a representative portion 1200(i) of decoder and switch matrix 240. Portion 1200(i) is repeated within decoder and switch matrix 240 for each of gain stages 302(i). Portion 1200(i) includes a switch 1204(i) that receives signals 1108-1114 and a control signal 1206(i) derived responsive to control signals 238 (that is, 1116 and 1120). In response to control signal 1206(i), switch 1204(i) connects either (i) ramp signals 1108 and 1110, or (ii) reference signals 1112 and 1114, to the inputs of a differential driver 1210(i). Differential drive 1210(i) generates gain control signal 120(i) responsive to its switched inputs.

More specifically, responsive to control signals 238, switch 1204(i) may be placed in any one of four different configurations. In a first configuration, switch 1204(i) connects reference signals 1112 and 1114 to differential driver 1210(i) such that gain control signal 120(i) has a static maximum amplitude that drives or sets the gain of corresponding gain stage 302(i) to a maximum value.

In a second configuration, switch 1204(i) connects reference signals 1112 and 1114 to differential driver 1210(i), in a manner that is inverted with respect to the first configuration, such that gain control signal 120(i) has a static minimum amplitude that sets the gain of corresponding gain stage 302(i) to a minimum value.

In a third configuration, switch 1204(i) connects ramp signals 1108 and 1110 to differential driver 1210(i) such that gain control signal 120(i) has an amplitude that follows a rising or increasing ramp function. For example, gain control signal 120(i) has an amplitude that increases over a time interval continuously and smoothly from the minimum amplitude to the maximum amplitude. As a result, the gain of corresponding gain stage 302(i) increases over the time interval continuously and smoothly from the minimum gain to the maximum gain for that gain stage.

In a fourth configuration, switch 1204(i) connects ramp signals 1108 and 1110 to differential driver 1210(i), in a manner that is inverted with respect to the third configuration, such that gain control signal 120(i) has an amplitude that follows a falling or decreasing ramp function. For example, gain control signal 120(i) has an amplitude that decreases over a time interval continuously and smoothly from the maximum amplitude to the minimum amplitude. As a result, the gain of corresponding gain stage 302(i) decreases over the time interval continuously and smoothly from the maximum gain to the minimum gain for that gain stage.

When the aggregate gain of amplifier array 204 is to be maintained at a present value, first gain stages among gain stages 302 of VGA 204 are set to their respective maximum gains, while second gain stages among gain stages 302 of VGA 204 are set to zero gain. This type of arrangement was described above in connection with Steps 1, 3 and 5 of FIG. 10A. To effect such an arrangement:

(i) first switches (among switches 1204) corresponding to the first gain stages of VGA 204 are set to their first configurations, so as to produce corresponding gain control signals at their maximum fixed amplitudes; and (ii) second switches (among switches 1204) corresponding to the second gain stages of VGA 204 are set to their second configurations, so as to produce corresponding gain control signals at their minimum fixed amplitudes.

When an aggregate gain change is required, the gain of one of the first gain stages is decreased to zero and the gain of one of the second amplifiers is increased to its maximum gain. This arrangement was described above in connection with Steps 2 and 4 of FIG. 10A. To achieve this, the switch corresponding to the one of the first gain stages (to be turned OFF) is placed into its third configuration and the switch corresponding to the one of the second amplifiers to be turned ON is placed in its fourth configuration. Then, the amplitudes of the gain control signals corresponding to these switches will ramp-up (e.g., increase) and ramp-down (e.g., decrease) as a function of ramp signals 1108 and 1110. In turn, the gains of the corresponding gain stages will ramp-up and ramp-down.

Figure 13:
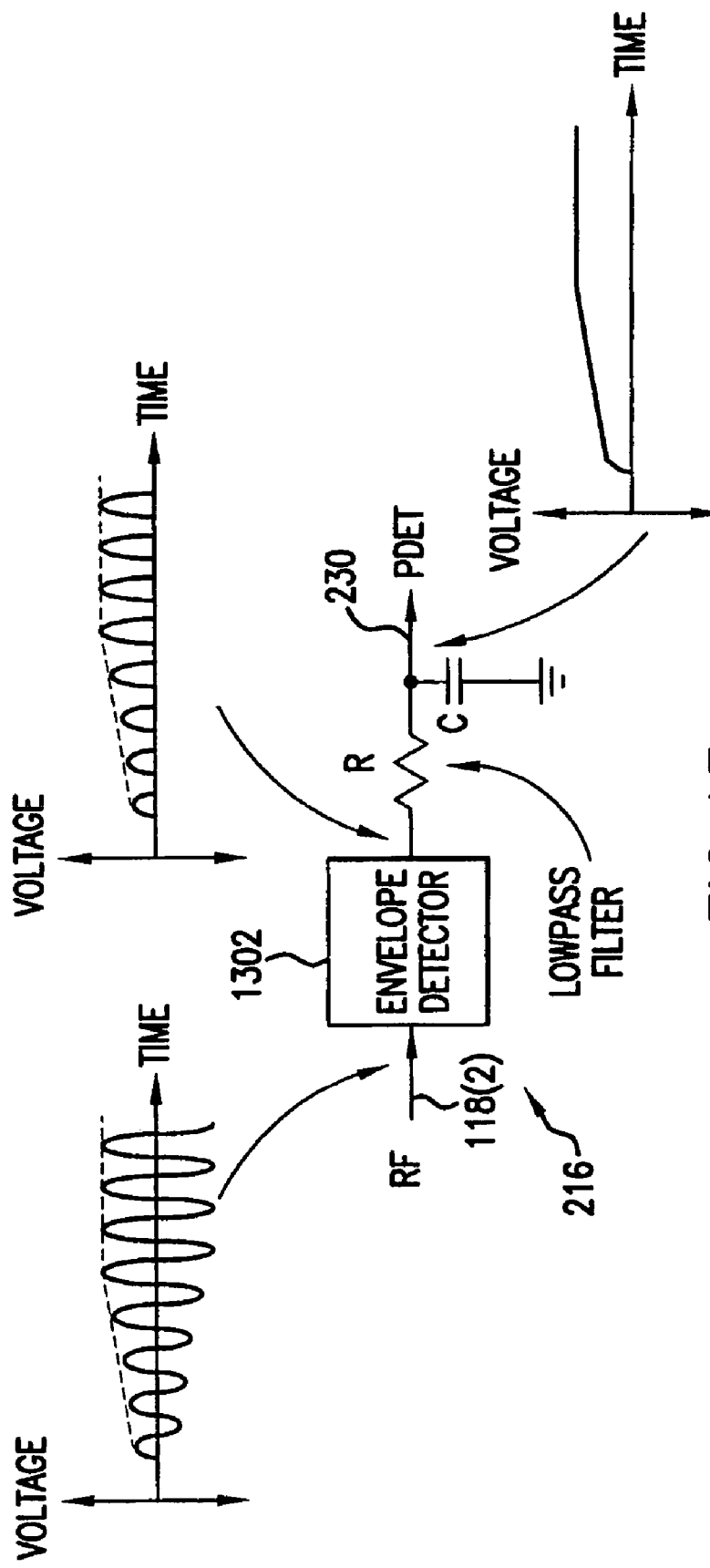
FIG. 13 is a block diagram of an example arrangement of a power detector of the amplifier assembly of FIG. 2.

FIG. 13 is a block diagram of an example arrangement of power detector 216. Also depicted in FIG. 13 are exemplary signal waveforms corresponding to various portions of the power detector circuit. Power detector 216 includes an envelope detector 1302 followed by a low pass filter. The low pass filter includes a resistor (R) and a capacitor (C). Power detector 216 produces power level signal 230 at a voltage level (PDET) that is proportional to the amplitude or power level of amplified signal 118(2).

Figure 14:
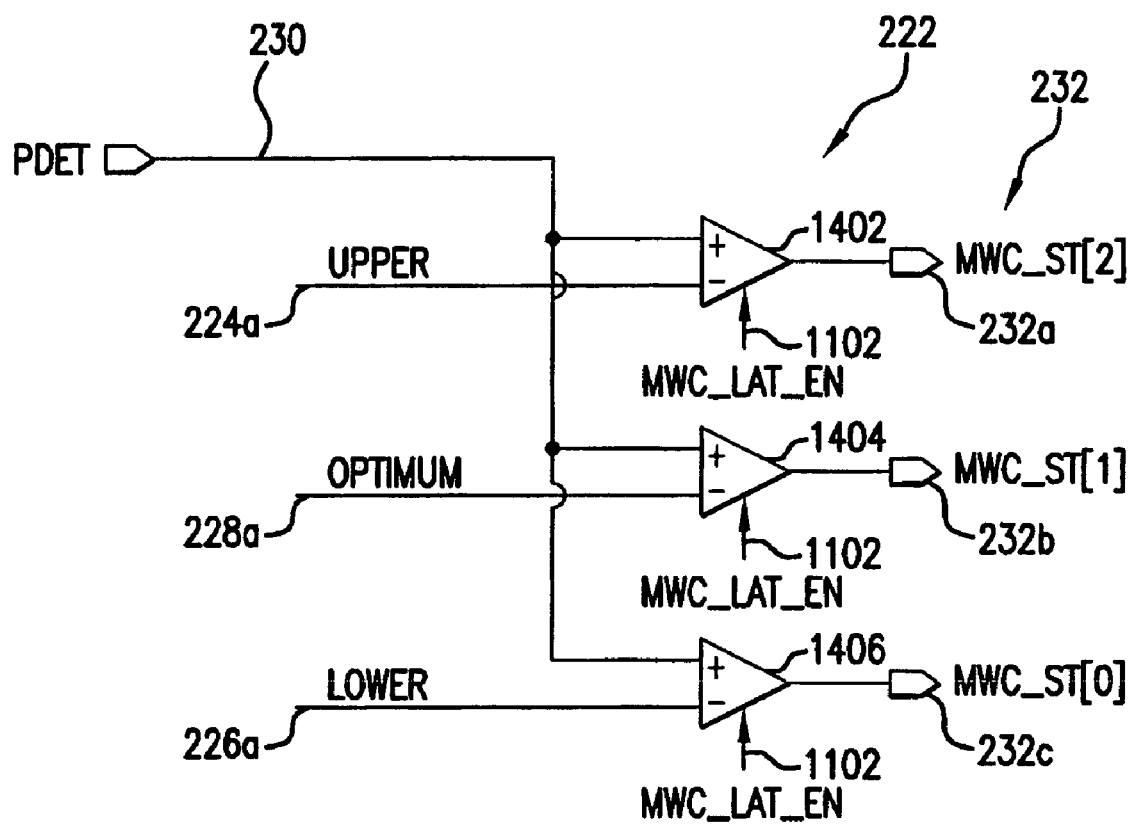
FIG. 14 is a circuit diagram of an example arrangement of the tri-level AGC window comparator of the amplifier assembly of FIG. 2.

FIG. 14 is a circuit diagram of an example arrangement of comparator 222. Comparator 222 includes an upper threshold comparator 1402 for comparing power level signal 230 to upper threshold 224a, to produce an upper threshold result 232a. Upper threshold result 232a indicates whether power level signal 230 is above or below upper threshold 224a. Comparator 222 includes a target threshold comparator 1404 for comparing power level signal 230 to target threshold 228a, to produce a target threshold result 232b. Result 232b indicates whether power level signal 230 is above or below target threshold 228a. Comparator 222 also includes a lower threshold comparator 1406 for comparing power signal 230 to lower threshold 226a, to produce a lower threshold comparison result 232c. Result 232c indicates whether power level signal 230 is above or below lower threshold 226a. Comparison result signal 232 comprises the set of comparison results 232a-232c.

Figure 15:
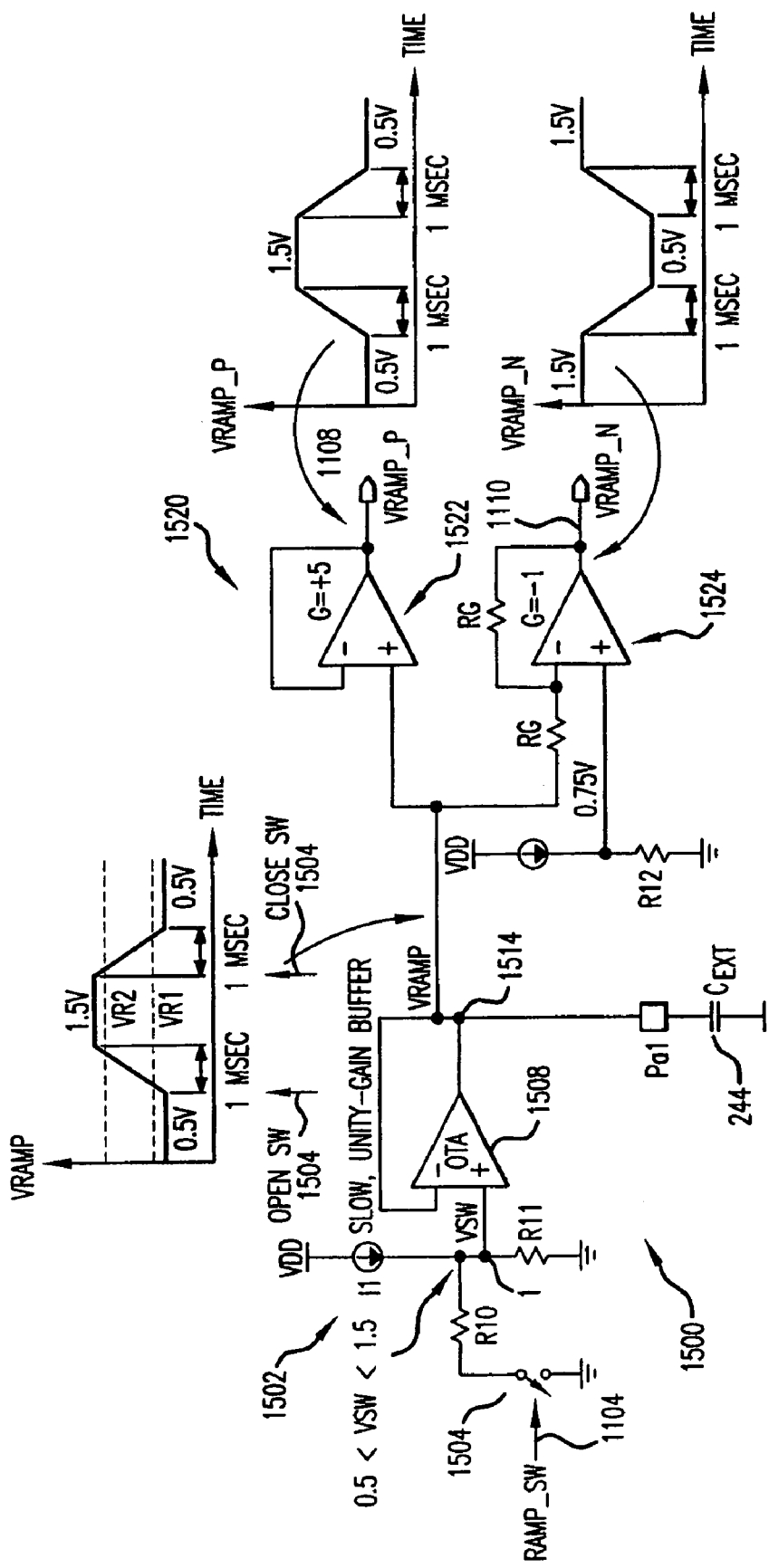
FIG. 15 is a circuit diagram of an example arrangement of a ramp generator portion of a signal generator of the amplifier assembly of FIG. 2.

FIG. 15 is a circuit diagram of an example arrangement of a ramp generator 1500 of signal generator 242. Also depicted in FIG. 15 are exemplary signal waveforms corresponding to various nodes in the circuit 1500 (for example, waveforms corresponding to signals 1108 (VRAMP_P), 1110 (VRAM_N), and VRAMP). Ramp generator 1500 includes a first stage 1502. First stage 1502 include a ramp generator switch 1504 coupled to a positive input of an operational transconductance amplifier (OTA) through a resistive voltage divider including resistors R10 and R11. A current source 11 is connected between the positive input of OTA 1508 and a power supply rail at voltage VDD. OTA 1508 is configured as a voltage follower amplifier having a current output. First stage 1502 also includes capacitor 244 ($C_{EXT}$) connected between an output terminal or node 1514 of OTA 1508 and ground. Switch 1504 is selectively opened or closed (i.e., either disconnected from ground or connected to ground) responsive to a ramp trigger signal, which is one of control signals 1104 from controller 233.

Assume initially that switch 1504 is open. When controller 233 closes switch 1504, a voltage VSW at the positive input of OTA 1508 becomes 0.5 volts. Then, when controller 233 opens switch 1104, the voltage VSW instantaneously jumps up to 1.5 volts. However, the output of OTA 1508, that is, the voltage VRAMP at node 1514 rises relatively slowly from 0.5 volts because the current produced by OTA 1508 charges capacitor 244. OTA 1508 has a differential voltage input and a current output (or even a differential voltage output). OTA 1508 is advantageous in this application because it produces a slow, smooth and continuous, linear voltage change at its output due to the large capacitance of capacitor 244. When controller 233 opens switch 1504, the voltage VSW instantaneously drops to 0.5 volts. However, the voltage VRAMP at node 1514 drops slowly from 1.5 volts down to 0.5 volts because of a discharge effect caused by capacitor 244. Any circuit that produces such a step voltage at the OTA input can be used in the present invention.

Ramp generator 1500 includes a second stage 1520 coupled to output node 1514. Second stage 1520 includes an optional first voltage follower amplifier 1522 for generating signal 1108 (VRAMP_P) and a second amplifier 1524 for generating signal 1110 (VRAMP_N). Thus, complimentary ramp signals 1108 and 1110 can be made to ramp-up or ramp-down on command by selectively opening and closing switch 1504.

The capacitance of capacitor 244 controls the slew time of ramp signal VRAMP (and correspondingly, the slew rates of ramp signals 1108 (VRAM_P) and 1110 (VRAMP_N)). The example slew time depicted in FIG. 15 is one milliseconds (ms). However a range of slew times, for example, between one ms and ten ms, may be used in the present invention. The capacitance of capacitor 244 is relatively large, for example, in the range of ten (10) nanoFarads. Thus, it is advantageous to have capacitor 244 off-chip, so as to correspondingly reduce the size of IC chip 202.

Figure 16:
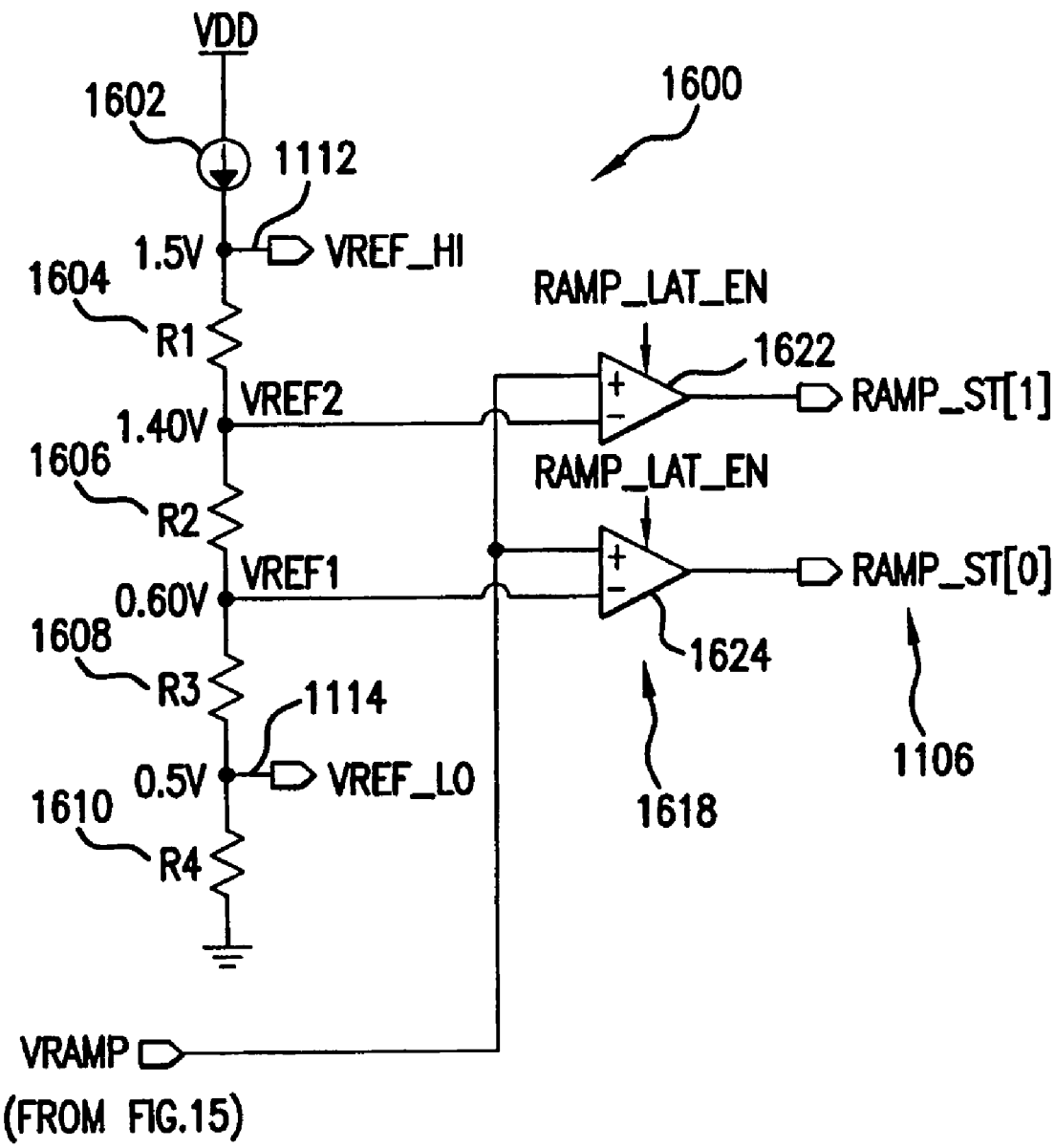
FIG. 16 is a circuit diagram of an example arrangement of a reference signal generator portion, and an associated ramp window comparator, of the signal generator of the amplifier assembly of FIG. 2.

FIG. 16 is a circuit diagram of an example arrangement of a reference signal generator 1600 of signal generator 242. Reference signal generator 1600 includes the following components connected in series and between a power supply rail at voltage VDD and ground: a current source 1602 and resistors 1604-1610. Reference signal 1112 (VREF_HI) is tapped-off between current source 1602 and resistor 1604. Signal 1114 (VREF_LO) is tapped-off between resistors 1608 and 1610.

Reference signal generator 1600 also includes a ramp window comparator 1618 including first and second comparators 1622 and 1624. First and second comparators 1622 and 1624 compare the voltage VRAMP, generated at the output of OTA 1508 (discussed in connection with FIG. 15), to respective tapped voltages VREF2 and VREF1. Voltages VREF2 and VREF1 are tapped-off between resistors 1604 and 1606, and between 1606 and 1608, respectively. Comparators 1622 and 1624 generate ramp state signal 1106 indicating whether VRAMP (and correspondingly, whether signals 1108 and 1110) has settled to a static value, that is, finished slewing, after switch 1504 has either opened or closed. After controller 233 commands ramp generator 1502 to generate ramp VRAMP, by toggling switch 1504 either open or closed, the controller monitors ramp state signal 1106 to determine when the ramp has finished slewing to its final high or low fixed voltage.

V. Process Monitor

Figure 16A:
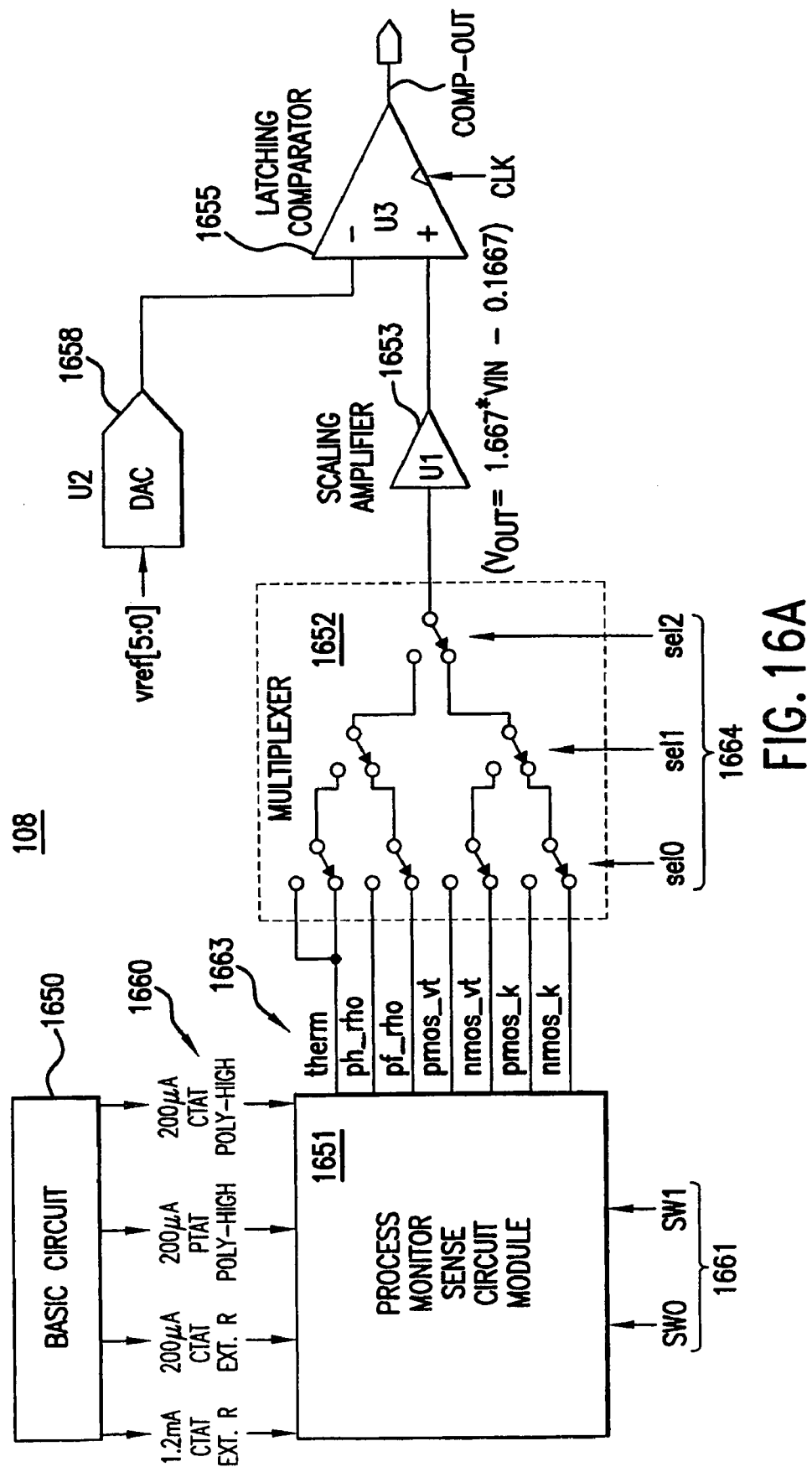
FIG. 16A is a circuit/block diagram of an example process monitor of the amplifier assembly of FIG. 1.

FIG. 16A is a circuit/block diagram of an example arrangement of process monitor 108, mentioned above in connection with FIGS. 1 and 2. The component values and transistor characteristics of a typical IC chip vary from one chip to another. Although ratios between one component and another match well on-chip, absolute values can vary widely. Process monitor 108 measures the absolute value of unit sample resistors and transistors. If a particular resistor or transistor measures high by a certain percentage, then all other resistors and transistors of that type will also measure high by the same amount. This information can be used to adjust the gain of an amplifier on the chip (for example, any of amplifiers 204 and 206 on IC chip 202) to a desired value, or to determine the true, corrected gain of such an amplifier. At any given time during the operation of amplifier assembly 102, the gain value of VGA 204 can be read through CI 109. Also, process information about process variations corresponding to IC chip 202 can be collected from process monitor 108. Based on the gain value, and the process information, gain correction factors can be derived, and then applied to any of amplifiers 204 and 206 to compensate for the process variations.

Process monitor 108 includes the following circuits: a bias circuit 1650, a sense circuit module 1651, a multiplexer 1652, an amplifier 1653, a latched-comparator 1655, and a digital-to-analog converter (DAC) 1658.

Bias circuit 1650 produces a set of controlled, predetermined bias currents 1660. Responsive to bias currents 1660 and a select signal 1661, sense circuit module 1651 produces various sensed signals 1663 indicative of process parameters of IC chip 202, and provides the sensed signals to multiplexer 1652. Responsive to a multiplexer select signal 1664, multiplexer 1652 provides a selected one of sensed signals 1663 to the group of circuits 1653, 1655, and 1658. A value of the selected sensed signal is determined using circuits 1653, 1655 and 1658.

Bias circuit 1650 produces bias currents 1660 based on either CTAT (constant-to-absolute temperature, which remains constant as temperature changes) or PTAT (proportional-to-absolute temperature, which increases linearly with absolute (Kelvin) temperature). In addition, each current of bias currents 1660 is based on a particular resistor type, such as an external (off-chip, and assumed to have a very low temperature coefficient), poly-high (high sheet-rho polysilicon, on-chip) or poly-low (low sheet-rho polysilicon, on-chip). "Poly" means polysilicon, and "sheet-rho" refers to resistivity per unit area of the IC chip. Each type of current is labeled accordingly: "CTAT Ext_R," "PTAT poly_high," or "CTAT poly-high." Other on-chip resistors, such as diffused resistors, can be used.

Figure 16B:
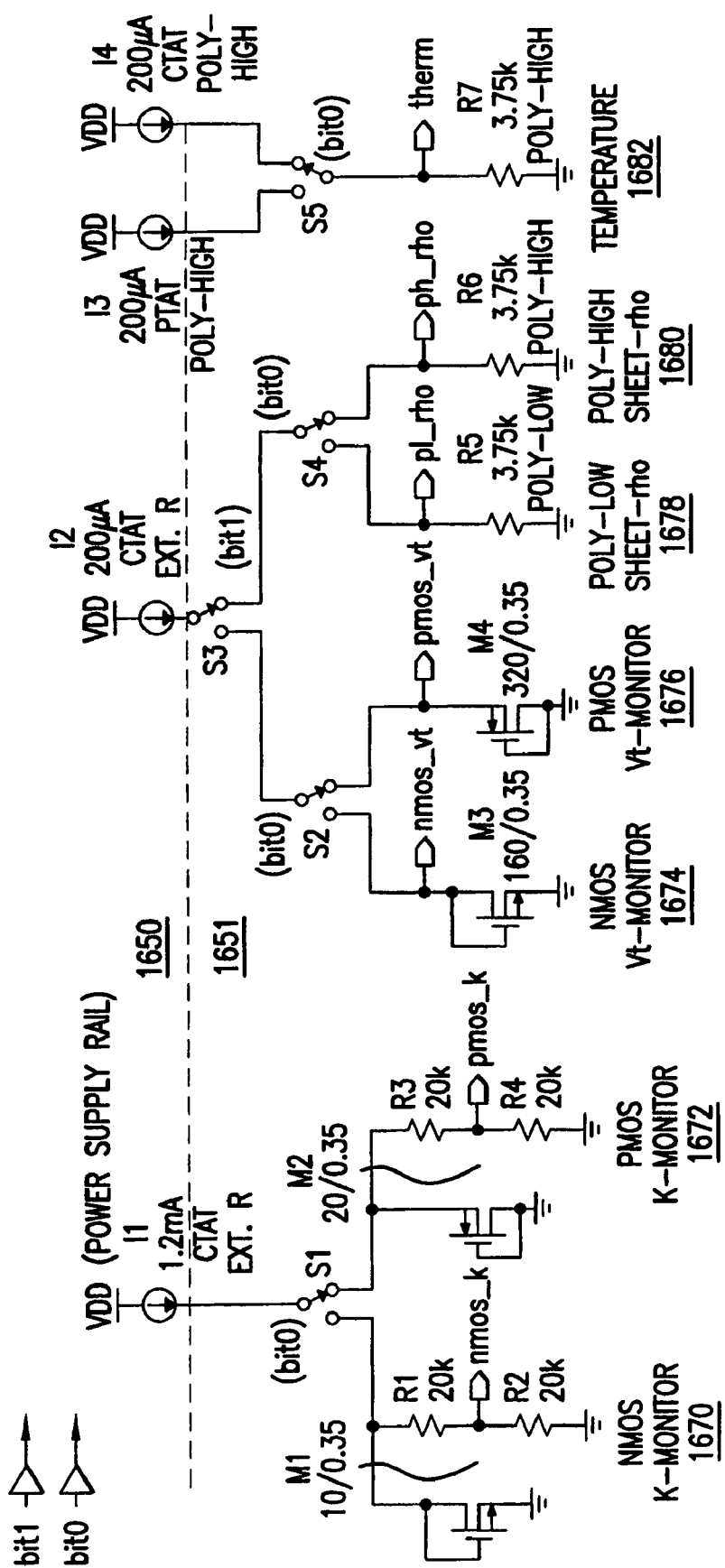
FIG. 16B is a circuit diagram of an example sense circuit module of the processor monitor of FIG. 16B.

FIG. 16B is a circuit diagram of an example arrangement of sense circuit module 1651. Also depicted in FIG. 16B is a portion of bias circuit 1650. Module 1651 includes a plurality of process monitor or sense circuits 1670-1680 for monitoring/sensing process-dependent parameters of IC chip or substrate 202. Module 1651 also includes a temperature monitor 1682. Switches S1-S5, controlled by signal 1661, apply appropriate ones of bias currents 1660 to various diode-connected transistors and grounded resistors of sense circuits 1670-1682. In response, sense circuits 1670-1682 produce sensed signals 1663 having values that provide information about process variations and temperature of IC chip 202. In the arrangement depicted in FIG. 16B, sensed signals 1663 are voltages. In an alternative arrangement, the sensed signals may be currents. Alternatively, a mix of voltages and currents may be generated.

Monitor or sense circuit 1670 monitors or senses an NMOS conductivity (k) of IC chip or substrate 202. Sense circuit 1670 produces a sensed signal nmos_k indicative of the NMOS conductivity.

Sense circuit 1672 monitors a PMOS conductivity of IC chip 202. Sense circuit 1672 produces a signal pmos_k indicative of the PMOS conductivity.

In sense circuits 1670 and 1672, transistors M1 and M2 are relatively small MOS transistors running at high current density, in a diode-connected set-up. This causes their VGS to be much larger than the transistor threshold voltage (VTH, indicated in labels "vt" and "Vt" in FIG. 16B). Thus, this configuration provides information about the transconductance parameter, k, of the transistors on the IC chip. Since VGS is large for these devices, a two-resistor voltage divider is used to reduce the sense voltage to within the same range of the other sense circuits.

Sense circuit 1674 monitors an NMOS transistor threshold (vt) of IC chip 202. Sense circuit 1674 produces a signal nmos_vt indicative of the NMOS threshold.

Sense circuit 1676 monitors a PMOS transistor threshold of IC chip 202. Sense circuit 1674 produces a signal pmos_vt indicative of the PMOS threshold.

In sense circuits 1674 and 1676, transistors M3 and M4 are also diode-connected, and are large devices running at low current density. This causes these device to have a VGS near their VTH.

Sense circuit 1678 monitors a resistivity per unit area, poly-low sheet-rho of IC chip 202. Sense circuit 1678 produces a signal pl_rho indicative of the resistivity per unit area, poly-low sheet-rho of IC chip 202.

Sense circuit 1680 monitors a resistivity per unit area, poly-high sheet-rho of IC chip 202. Sense circuit 1680 produces a signal ph_rho indicative of the resistivity per unit area, poly-high sheet-rho of IC chip 202.

In sense circuits 1678 and 1680, two resistors, R5 and R6 are 3.75K ohm poly-low and poly-high resistors (respectively) that are biased at a fixed current (external R, CTAT). The voltage across these resistors is proportional to the sheet-rho of each resistor.

Sense circuit 1682 monitors a temperature of IC chip 202, and produces a signal therm indicative of this temperature. In sense circuit 1682, resistor R7 is used to determine chip temperature. This is done by connecting either poly-high/CTAT or poly-high/PTAT reference current to this resistor. Since the reference current is based on a poly-high resistor in both cases, the effects of process variation on the poly-high resistor is removed, leaving only CTAT vs. PTAT variations (i.e. temperature variations).

Referring again to FIG. 16A, multiplexer 1652, amplifier 1653, comparator 1655 and DAC 1658 cooperate with CI 109 to determine the values of the various sensed signals 1663. Multiplexer 1652 selects any one of sensed signals 1663, responsive to control signal 1664. Amplifier 1653 scales the selected sensed signal, and presents the scaled, selected sensed signal to latching comparator 1655. Amplifier 1653 has an output voltage range between 0.5 and 1.5 volts, approximately, which is the same as the output range of DAC 1658. Comparator 1655 is in a latch mode when its clock input is a logic "1," and in a track (or transparent) mode when its clock input is a logic "0." At the same time, switches S1-S5 apply bias current(s) to the sense circuit(s) that produce(s) the selected sensed signal(s).

IC 109 applies an input vref to DAC 1658. Namely, an input of "000000" produces 0.5 volts at the DAC output, while "111111" produces 1.5 volts. DAC 1658 applies its output to a comparison input of comparator 1655. Comparator 1655 compares the DAC output voltage to the selected scaled sensed signal from the corresponding sense circuit, and produces comparison result output comp_out. CI 109 accesses or reads the value of comp_out. Comparator 1655 uses a successive-approximation-register (SAR) algorithm to determine the value, e.g., voltage, of the sensed signal by comparing the sense signal against the DAC output voltage with 6-bit resolution. The SAR operation is controlled through CI 109 (e.g., by external controller 112), which sets the DAC input bits (and hence its output voltage) and clocks the comparator. If the output of the comparator is a logic "1" after clocking, the sensed signal or voltage (at the scaling amplifier output) was larger than the DAC voltage (and vice-versa).

Multiplexer 1652, amplifier 1653, comparator 1655 and DAC 1658 cooperate with CI 109 to determine the values of the various sensed signals 1663. Any other circuit may be used to perform this function. In an alternative arrangement, sense module 1651 generates sensed signals 1663 as digital signals, for example, using an analog-to-digital converter (ADC) on the output of each sense circuit in module 1651, and presents the digital signals to CI 109. In this arrangement, circuits 1652, 1653, 1655 and 1658 may be omitted.

VI. Method Flow Charts

Figure 17:
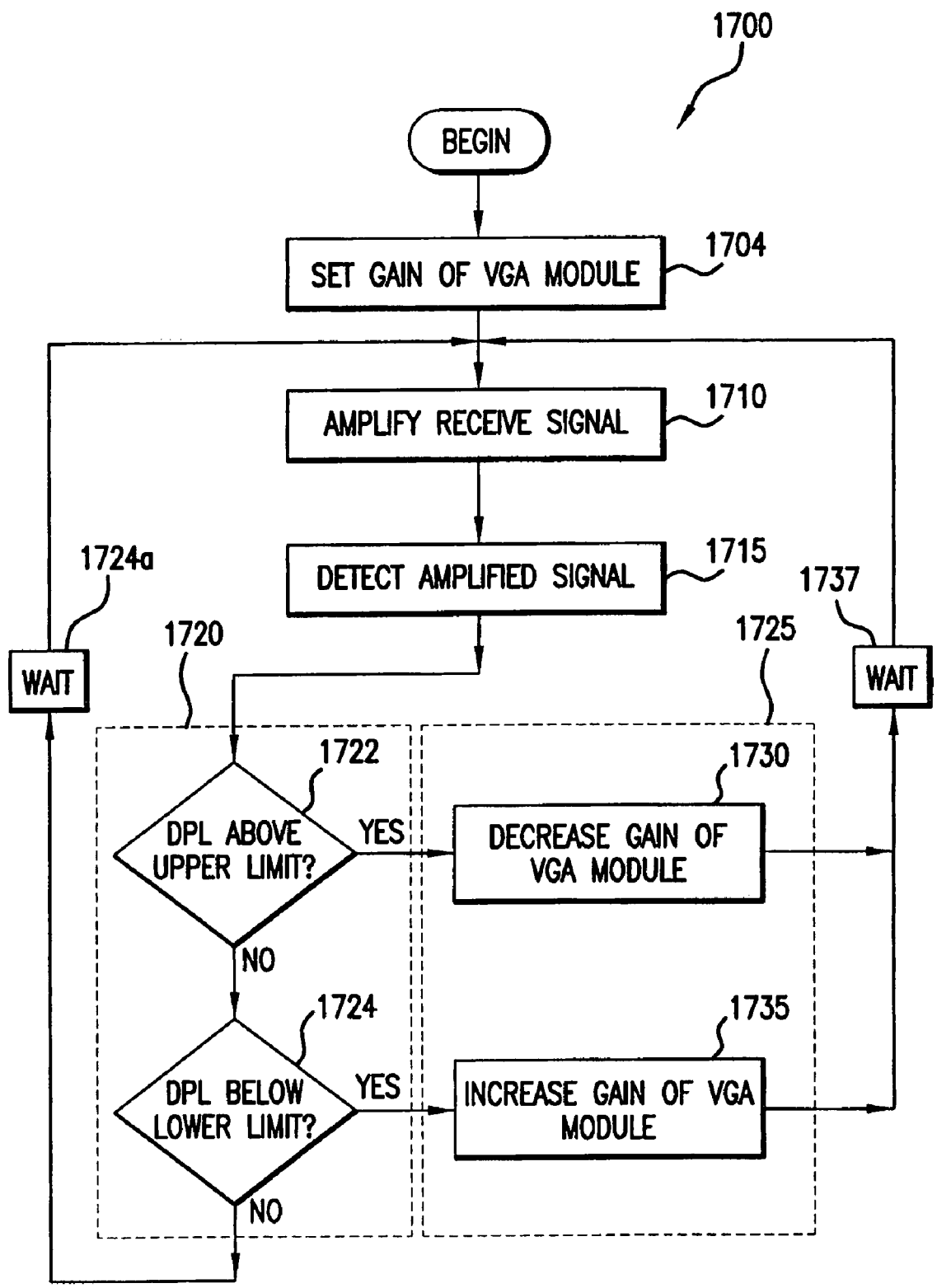
FIG. 17 is a flowchart of an example method of controlling gain that may be performed in the amplifier assembly of FIG. 2.

FIG. 17 is a flowchart of an example method 1700 of controlling gain that may be performed in amplifier assembly 102. An initial step 1704 includes setting a gain of a VGA module, for example, amplifier module 104. For example, this step includes setting an initial gain of first stage amplifier 204, e.g., amplifier array 204, in accordance with gain control signals 120, and setting initial gains of second stage amplifiers 206 to programmed gain values. The gains may be set to any desired gain values. For the purposes of gain changes that may occur in subsequent steps of method 1700, amplifiers 206 can be considered to have relatively fixed gain set to initial values in step 1704, as compared to VGA 204, which has a relatively dynamic gain.

A next step 1710 includes amplifying a receive signal to produce an amplified signal. For example, this step includes amplifying receive signal 114 with amplifier array 204 and second stage amplifier 206(2) to produce amplified signal 118(2).

A next step 1715 includes detecting a power level of the amplified receive signal generated in step 1710. For example, power detector 216 detects the power level/amplitude of signal 118(2), to produce power level signal 230. Power level signal 230 is indicative of the power level of receive signal 114, and amplified signals 210 and 118.

A next step 1720 includes determining whether the power level of the amplified signal (as indicated by the detected amplified signal) is between an upper threshold (e.g., threshold 224a) and a lower threshold (e.g., threshold 226a) defining an AGC window. Step 1720 includes further steps 1722 and 1724. Step 1722 includes comparing the detected power level ("DPL") to the upper threshold, and step 1724 includes comparing the detected power level to the lower threshold. If the detected power level of the amplified signal is between the upper and lower thresholds, that is, within the AGC window, then flow proceeds back to step 1710 through a delay or wait step 1724a. Step 1724a corresponds to a programmable time interval, and may be included in step 1724. Steps 1720 and 1724a may be performed under the control of controller module 220.

If the power level of the amplified signal is not between the upper and lower thresholds, that is, within the AGC window, then flow proceeds to a next step 1725. Step 1725 includes changing the gain of the VGA module so as to drive the power level of the amplified signal in a direction toward a target threshold (e.g., threshold 228a) intermediate the upper and lower thresholds. Step 1725 includes changing the gain until the power level of the amplified signal crosses the target threshold. The gain change is smooth and continuous, in accordance with a ramp function.

Step 1725 includes further steps 1730 and 1735. Step 1730 includes decreasing the gain when comparison step 1722 indicates the power level of the amplified signal is above the upper threshold. Step 1735 includes increasing the gain when comparison step 1724 indicates the amplified signal power level signal is below the lower threshold. Step 1725 may be performed under the control of controller module 220. For example, controller 220 generates control signals 120 so as to change the gain of amplifier array 204, and thus, the gain of amplifier module 104.

After the gain change of step 1725, flow proceeds back to step 1710 through a delay or wait step 1737 (similar to wait step 1724a), and the process described above repeats. Step 1737 corresponds to a programmable time interval, and may be included in both of steps 1730 and 1735.

In an alternative arrangement of method 1700, the gains of both amplifiers 204 and 206 may be changed in step 1725.

The example gain change scenarios discussed above in connection with FIGS. 10A and 10B may be achieved in accordance with method 1700. For example, at sample time 1052 in FIG. 10B (corresponding to step 1722 in method 1700), controller module 220 determines or becomes aware that the gain of VGA 204 needs to be reduced. In response, controller module 220 reduces the gain of VGA 204 between times 1052 and 1054 (corresponding to step 1730 of method 1700), that is, until the power level signal crosses target threshold 228a. Controller module 220 reduced the gain of VGA 204 in accordance with the gain change scenario of FIG. 10A. Then, as depicted in FIG. 10B, controller module 220 waits until a next sample time (corresponding to wait step 1737 in method 1700), before again polling comparison result signal 232 to test whether another gain change is required.

Frequent AGC induced gain changes can sometimes cause disruptive amplitude changes in an AGC controlled output signal. For example, the frequent AGC induced gain changes can sometimes disrupt the operation of circuits or processors, such as demodulators, that process the AGC controlled output signal. The present invention advantageously reduces the frequency of AGC induced gain changes compared to conventional AGC systems. In the present invention, this advantageous effect arises from a combination of (i) polling comparison result signal 232 at spaced time intervals (e.g., every $t_{sample}$) to determine if a gain change is required, and (ii) maintaining power level signal 230 at or near target threshold 228a, within an AGC window, and then only changing the gain when the power level signal is outside of the AGC window. Either one of these techniques taken alone can reduce the frequency of gain changes, but together these techniques even further reduce the frequency of gain changes.

Figure 18:
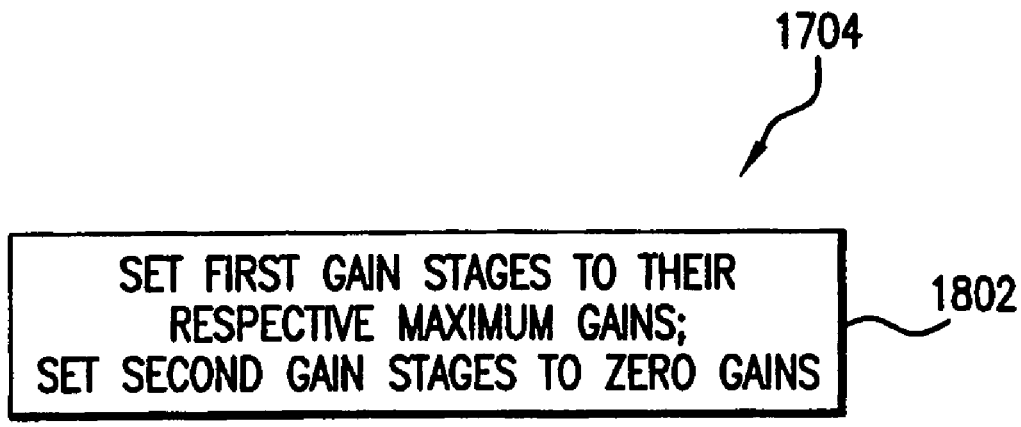
FIG. 18 is a flow chart expanding on an initial gain setting step of the method of FIG. 17, according to an embodiment of the present invention.

FIG. 18 is a flow chart expanding on initial gain setting step 1704, as performed in amplifier assembly 102. Step 1704 includes a further step 1802, wherein controller module 220 generates gain control signals 120 such that (i) first gain stages among gain stages 302 in VGA 204 are set to their respective maximum gains, and (ii) second gain stages among gain stages 302 in VGA 204 are set to zero gain. The control signals 120 corresponding to the first gain stages of VGA 204 have fixed maximum amplitudes, and the control signals corresponding to the second gain stages of VGA 204 have fixed minimum amplitudes. With reference again to FIG. 2, in step 1802, CI 109 commands controller module 220 to cause the gain of VGA 204 to be set to the desired value.

Figure 19:
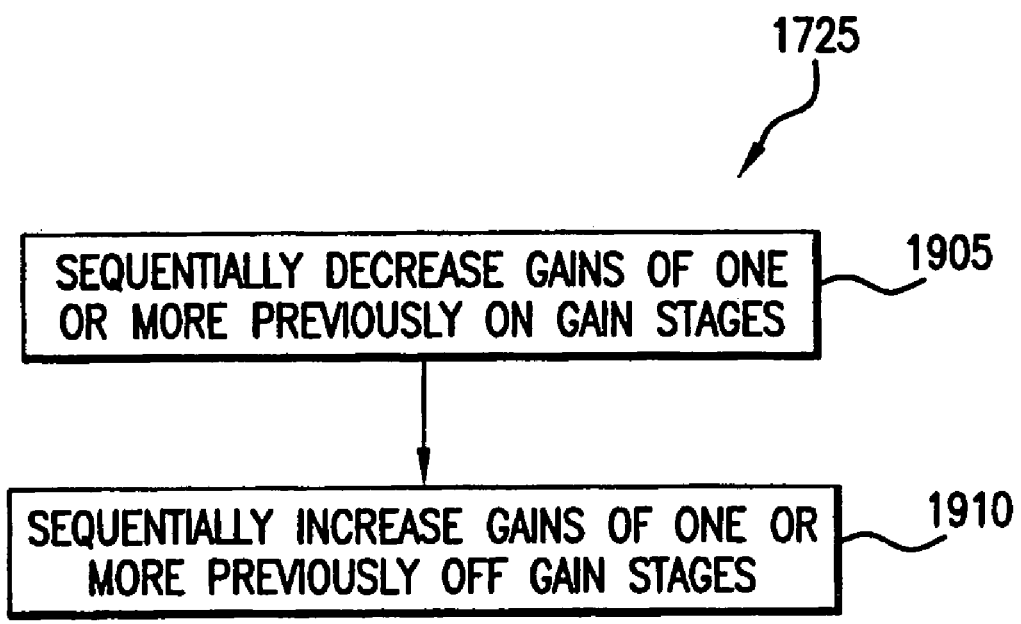
FIG. 19 is a flow chart expanding on a gain change step of the method of FIG. 17, according to an embodiment of the present invention.

FIG. 19 is a flow chart expanding on gain change step 1725, as performed in amplifier assembly 102. It is assumed that before step 1725 is executed, VGA 204 is configured to have an aggregate gain as a result of first gain stages thereof being set to their respective maximum gains and second gain stages thereof being set to zero gain. A step 1905 includes sequentially decreasing the gains of one or more of the first gain stages to zero gain according to a ramp function. A step 1910 includes sequentially increasing the gains of one or more of the second gain stages, corresponding to the one or more of the first gain stages, to their respective maximum gains according to the ramp function. Steps 1905 and 1910 may be performed concurrently. Alternatively, steps 1905 and 1910 may be performed in series with each other and such that step 1905 precedes step 1910, or alternatively, in a reverse order. Method 1900 may be performed to either increase the aggregate gain (as would be the case in step 1730) or decrease the aggregate gain (as would be the case in step 1735).

Figure 20:
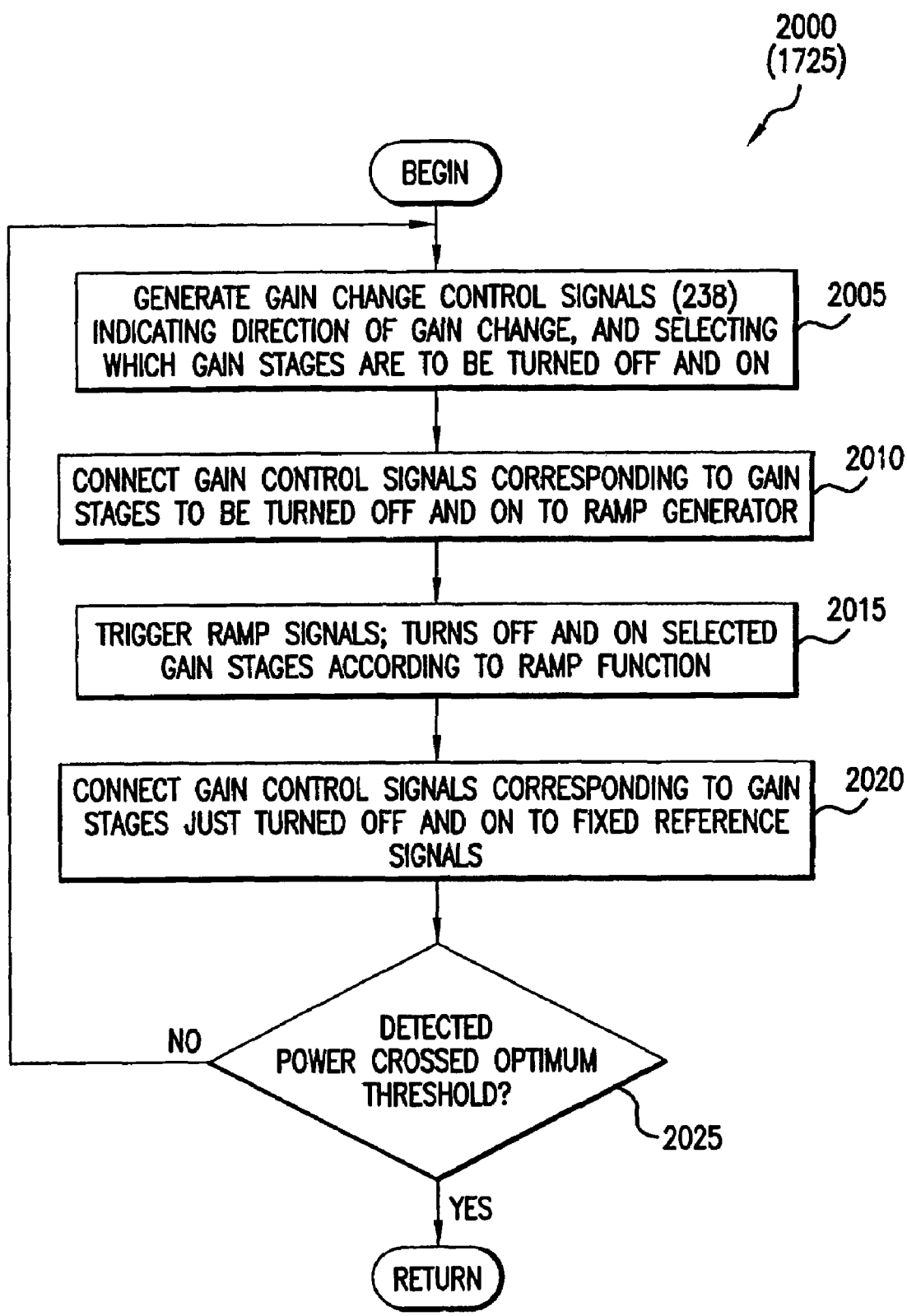
FIG. 20 is a flow chart of a low-level example method expanding on the gain change step of the method of FIG. 17, which focuses on operations performed by elements of a controller module of the amplifier assembly of FIG. 2 during the gain change.

FIG. 20 is a flow chart of a low-level example method 2000 expanding on gain change step 1725 and focusing on operations performed by elements of controller module 220 during the gain change. As mentioned above, step 1725, and thus, method 2000, is invoked when step 1720 indicates an aggregate gain change is required. For example, when controller 233 determines, in response to comparison result 232, that an aggregate gain change is required.

It is assumed that before method 2000 begins, step 1704 set the aggregate gain of VGA 204 to an initial value. In this condition, first gain stages among gain stages 302 of VGA 204 are set to their maximum gains and second gain stages among gain stages 302 of VGA 204 are set to their minimum gains, so as to set the aggregate gain of VGA 204 to the initial value. More specifically, in switch matrix 240:

(i) first switches (among switches 1204) corresponding to the first gain stages are set to their first configurations, and thus, the corresponding first gain control signals are set to their maximum amplitudes; and (ii) second switches (among switches 1204) corresponding to the second gain stages are set to their second configurations, and thus, the corresponding second gain control signals are set to their minimum amplitudes.

In a first step 2005, controller 233 receives comparison result signal 232. In response, controller 233 indicates to switch matrix 240, via signals 238, the direction of the required gain change, and thus, which gain stage among the first gain stages is to be turned OFF, and which gain stage among the second gain stages is to be turned ON. Essentially, in response to comparison result 232, controller 233 selects which gain stages are to be turned OFF and ON to effect the gain change.

In a next step 2010, responsive to control signals 238, switch matrix 240 sets:

(i) the switch corresponding to the gain stage to be turned OFF to either its third or fourth configuration, as appropriate; and (ii) the switch corresponding to the gain stage to be turned ON to either its fourth or third configuration, as appropriate.

Essentially, the gain control signals corresponding to these two switches are connected to the output of the ramp generator, and are thus are ready to be driven by a ramp signal.

In a next step 2015, controller 233 triggers ramp generator 1502 to generate the ramp signals 1108 and 1110 according to the ramp function, e.g., by toggling switch 1504. In response to ramp signals 1108 and 1110, the gain control signals corresponding to the switches coupled to ramp generator 1502 turn OFF and ON their corresponding gain stages.

In a next step 2020, controller 233 monitors ramp state signal 1106 to determine when ramp signals 1108 and 1110 have settled to their final fixed values, that is, when the ramp has finished slewing. When this occurs, controller 233 sets:

(i) the switch corresponding to the gain stage just turned OFF to either its first or second configuration, as appropriate; and (ii) the switch corresponding to the gain stage just turned ON to either its second or first configuration, as appropriate.

Essentially, the gain control signals corresponding to these two switches are now connected to the output of the reference signal generator, and are thus held at respective fixed amplitudes.

In a next step 2025, controller 233 determines if a further gain change is required. That is, controller 233 determines if power level signal 230 has still not crossed target threshold 238*a*. The time delay involved in performing this step contributes to the pause between successive incremental gain changes discussed above in connection with FIGS. 10B and 10A.

If step 2025 indicates no further gain change is required, then method 2000 stops. On the other hand, if step 2025 indicates a further gain change is required, then flow proceeds back to step 2005, and the gain change process repeats. In this manner, method 2000 changes gain one step at a time, that is, in each iteration through steps 2005-2025, until the power level signal 230 is at or near target threshold 238*a*.

VII. Example System—CATV Set-top Box

Figure 21:
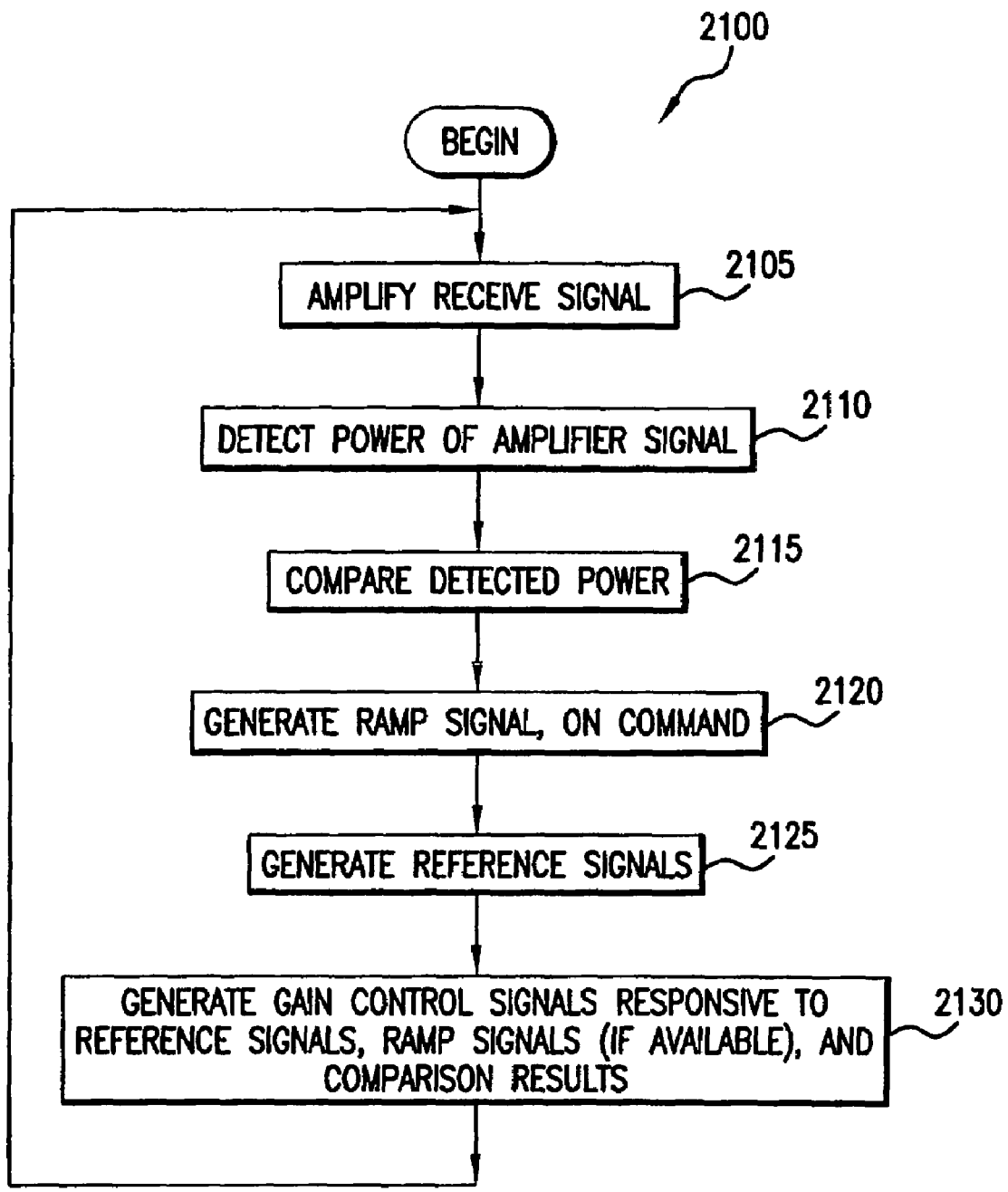
FIG. 21 is a flow chart of another example method of controlling VGA gain performed in the amplifier assembly of FIG. 2.

FIG. 21 is a flow chart of another method of controlling the gain of VGA 204, in amplifier assembly 102. VGA 204 includes gain stages 302 connected in parallel with each other and that collectively establish an aggregate gain of the VGA. The VGA receives gain control signals 120, each for controlling a gain of a corresponding one of parallel gain stages 302.

In a first step 2105, VGA 204 amplifies receive signal 114 in accordance with the aggregate gain to produce an amplified output signal 210.

In a next step 2110, power detector 216 produces detected power 230 indicative of a power of amplified signal 210 produced by the VGA. In a next step 2115, comparator module 218 produces comparison result signal 232 indicative of a relative relationship between the detected power signal and thresholds 224*a*-228*a*.

In a next step 2120, ramp generator 1502 generates ramp signals 1108 and 1110 on command.

In a next step 2125, reference signal generator 1600 generates reference signals 1112 and 1114 having fixed amplitudes.

In a next step 2130, controller module 220 generates gain control signals 120 responsive to comparison result signal 232, reference signals 1112 and 1114, and ramp signals 1108 and 1110 (when the ramp signals are generated). Controller module 220 generates gain control signals 120 such that amplified output signal 210 maintains a substantially constant amplitude as the power of receive signal 114 varies over time.

Figure 22:
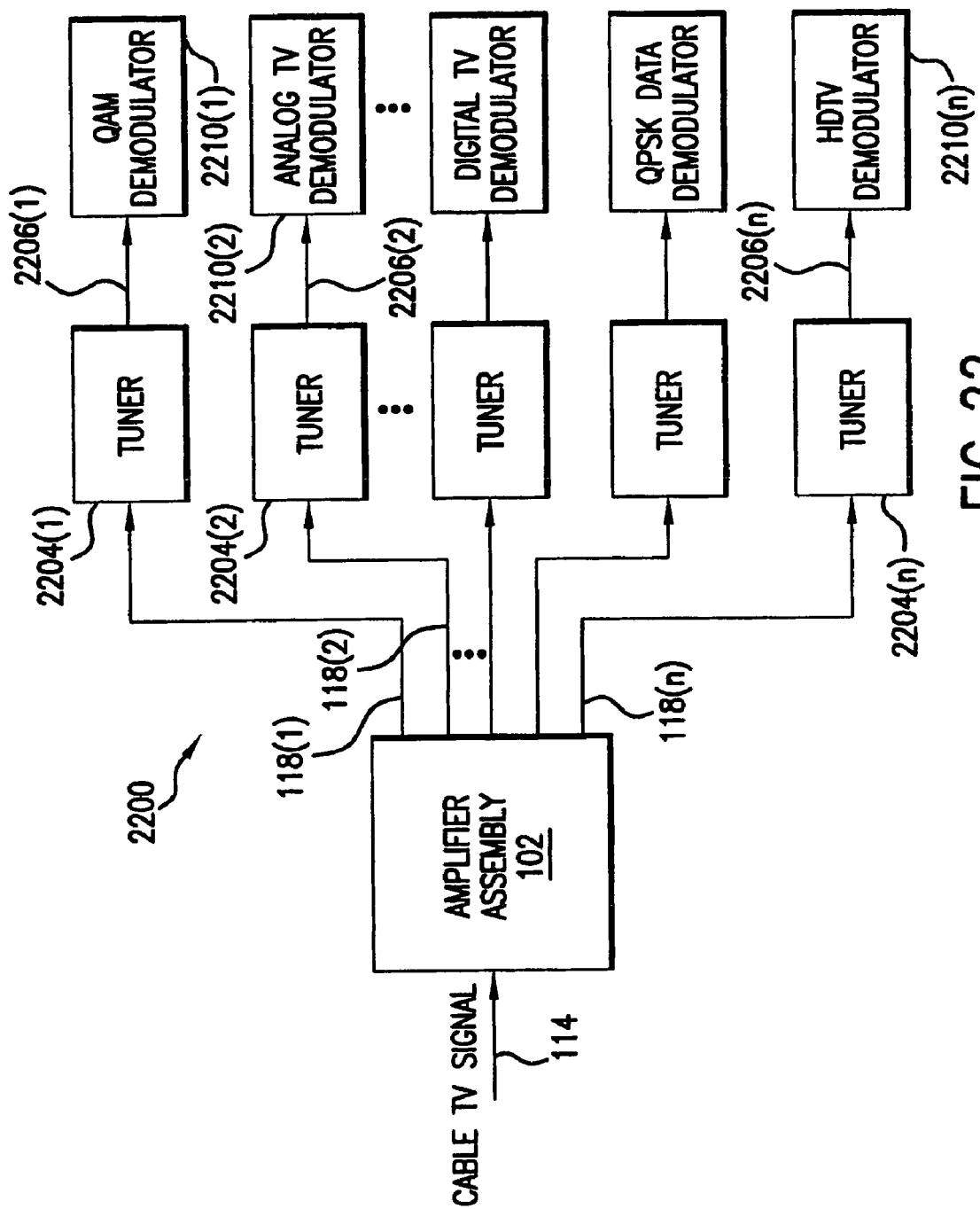
FIG. 22 is an example system in which the amplifier assembly of FIG. 1 may be used.

FIG. 22 is a block diagram of an example system 2200, such as a CATV set-top box, in which amplifier assembly 102 may be used. Amplifier assembly 102 provides amplified signals 118(1)-118(n) to corresponding individual tuners 2204(1)-2204(2). Each signal 118(i) includes a plurality of CATV channels, as mentioned above. Each tuner 2204(i) selects a subset only, for example, one, of the many frequency channels presented in corresponding signal 118(i). Each tuner 2204(i) produces a signal 2206(i) including the selected channel only.

Tuners 2204(1)-2204(n) provide signals 2206(1)-2206(n) to corresponding ones of demodulators 2210(1)-2210(n), as depicted in FIG. 22. Each demodulator 2210(i) demodulates the selected channel presented in its corresponding signal 2206(i). Amplifier assembly 102, tuners 2204 and demodulators 2210 may be all controlled by a controller, such as controller 112 discussed in connection with FIG. 2 (but not shown in FIG. 22).

Due to the AGC operation of amplifier assembly 102, as described above, each tuner-demodulator pair (2204(i)-2210(i)) advantageously receives a corresponding signal 118(i) having (i) the plurality of frequency channels present in signal 114, and (ii) a substantially constant aggregate power level, under fluctuating amplitude conditions of input signal 114. The smooth and continuous gain change operation of amplifier assembly 102 advantageously avoids abrupt, disruptive power level discontinuities in signals 118, and thus in signals 2206. As a result, the gain changes in amplifier assembly 102 are transparent to demodulators 2210. For example, demodulators 2210 can maintain a successful "lock" on, or tracking of, signals 2206 during gain changes in amplifier assembly 102 that compensate for substantial fluctuations in the power of input signal 114. Another advantage of the amplifier assembly is that AGC induced gain changes are less frequent than in conventional systems, for the reasons mentioned above in connection with FIG. 17.

Another advantage is that the AGC operation of amplifier assembly 102 is autonomous, that is, the AGC in amplifier assembly operates without the need of any feedback signal, such as a receive power indicator, from either tuners 2204 or demodulators 2210. Another advantage is that the power levels of signals 118 may be controlled individually using only one component in the system, namely, amplifier assembly 102. Thus, each signal 118(i) delivers the required power to each tuner-demodulator pair, and this required power may differ substantially between the tuner-demodulator pairs.

VIII. Terrestrial Digital TV ("DTV") Applications

The present invention, and/or portions thereof, can be used with cable TV (e.g., NTSC, digital TV and cable modem) and/or terrestrial digital TV ("DTV") applications. When implemented in a DTV application, the present invention is referred to herein as a DTV LNA.

DTV LNA's typically have requirements that exceed requirements of Cable TV (e.g., NTSC, digital TV, and cable modem) LNAs. For example, a DTV LNA typically needs more gain, a lower noise figure, and needs to handle relatively strong adjacent channels.

The present invention, and/or portions thereof, can be implemented as a variable gain LNA for off-air DTV. In such an environment, the invention provides relatively high gain, low noise, low distortion, and large AGC range. The present invention can be implemented, for example, in a United States 8-VSB DTV system.

A DTV LNA in accordance with the invention includes a two-stage amplifier with the first stage having a relatively higher, variable, gain. A power detector coupled to an output of the DTV LNA drives an automatic gain control ("AGC") circuit, which sets the gain of the DTV LNA to a-fixed output level. AGC level can be set to any value by a digital interface circuit.

The first amplifier provides a variable gain of, for example, 20 dB. The second amplifier provides a generally fixed gain of, for example, 7 dB. The system has a total gain of approximately 27 dB, and an AGC range of approximately 50 dB. The invention is not, however, limited to these examples.

Off-air DTV signals can vary widely in terms of received power level and can come in quite strongly. In some cases, the desired channel is very weak, and can have a very strong adjacent channel, for example, at a level of 40-50 dB stronger than the desired signal. Accordingly, the DTV LNA is designed to provide a relatively high gain, low noise figure, low distortion, and large AGC range.

Since off-air signals can be very weak, the noise figure of both the tuner and LNA are kept relatively low. Thus, for a tuner having a noise figure of approximately 18 dB, the gain of the LNA should be relatively high and noise figure of the LNA should be relatively low. For example, an LNA gain of 27 dB and an LNA noise figure of 4.8 dB is sufficient to provide a system noise figure of 5 dB.

The invention provides autonomous AGC circuits that self level the output to a desired level. The level can be set by 12C control, by an external voltage, and/or by digital control. The DTV LNA can have one or more outputs. Generally, all outputs are differential.

A. PIN Diode

Received signals can range from −86 dBm to +10 dBm, for example. This means that the DTV LNA will need to handle a range of signals, without distortion, while maintaining good signal to noise ratio ("SNR"). This is optionally performed with a very linear front end circuit. Alternatively, or additionally, this is performed with a positive-intrinsic-negative ("PIN") diode configured as a current-controlled RF resistor.

A PIN diode is a semiconductor device that operates as a variable resistor at RF and microwave frequencies. The resistance value of the PIN diode is determined by a forward biased DC current. PIN diodes can control relatively large RF signals while using relatively small levels of DC excitation. The PIN diode provides a relatively simple and inexpensive way to dynamically adjust attenuation. The attenuation can be used, for example, when a relatively powerful unwanted signal is present at the input.

Figure 23:
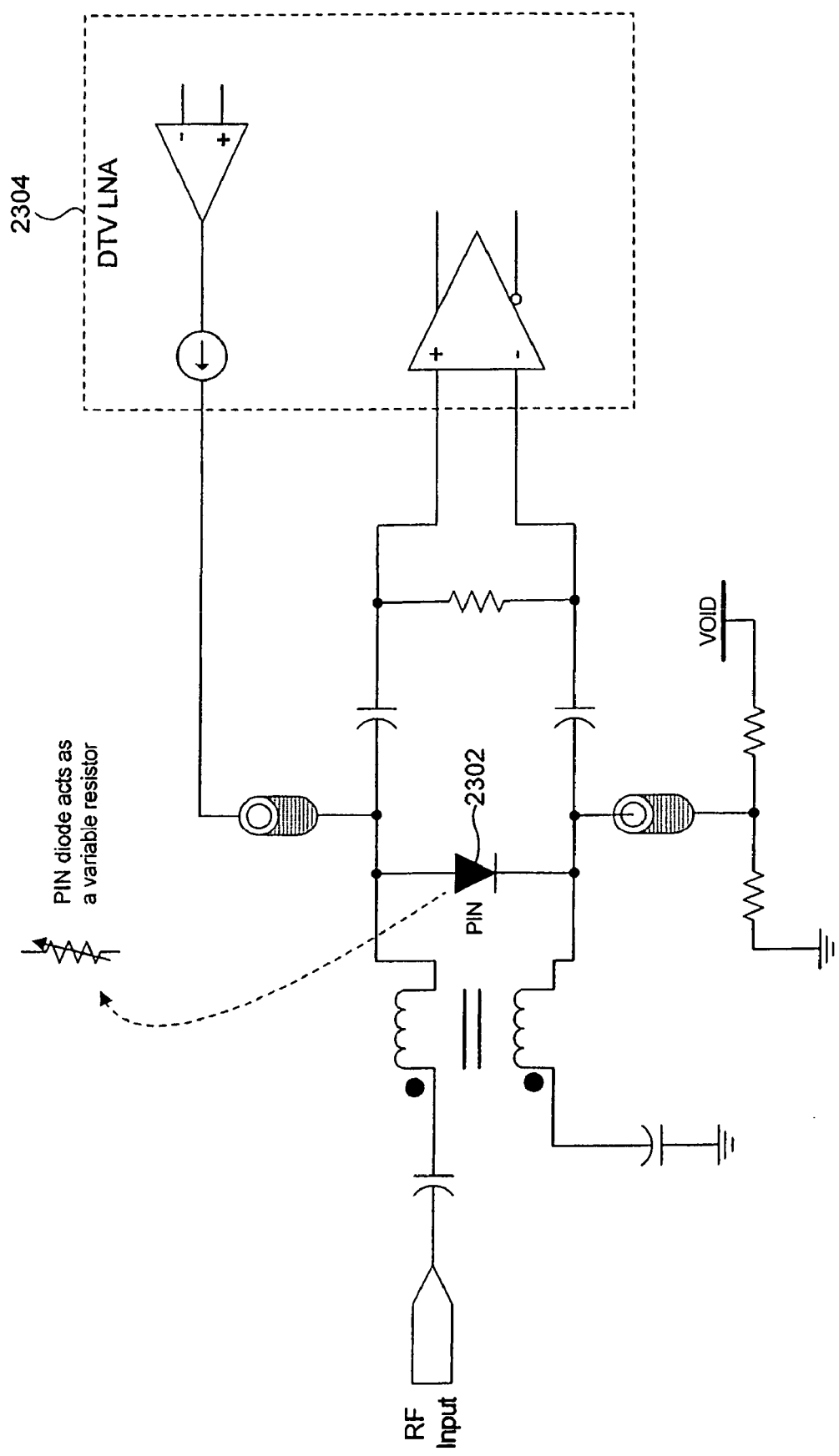
FIG. 23 is a block diagram of an optional PIN diode coupled between differential inputs to a DTV LNA.

Referring to FIG. 23, a PIN diode 2302 is coupled between differential inputs of a DTV LNA 2304. When the input signal is large, the PIN diode 2302 is driven to a relatively low impedance state, thus reducing the signal level at the input of the DTV LNA 2304. This allows the DTV LNA to have a lower noise figure, since it does not have to directly handle as large an input. An on-chip current-driver/operational amplifier is optionally used to drive the PIN diode.

B. Switched LNA

The invention further includes an optional switched LNA first stage that includes independently controlled LNAs for different inputs. The different inputs can be, for example, from an antenna and from a cable. This is useful for example, when different gains are needed for different inputs.

Figure 24:
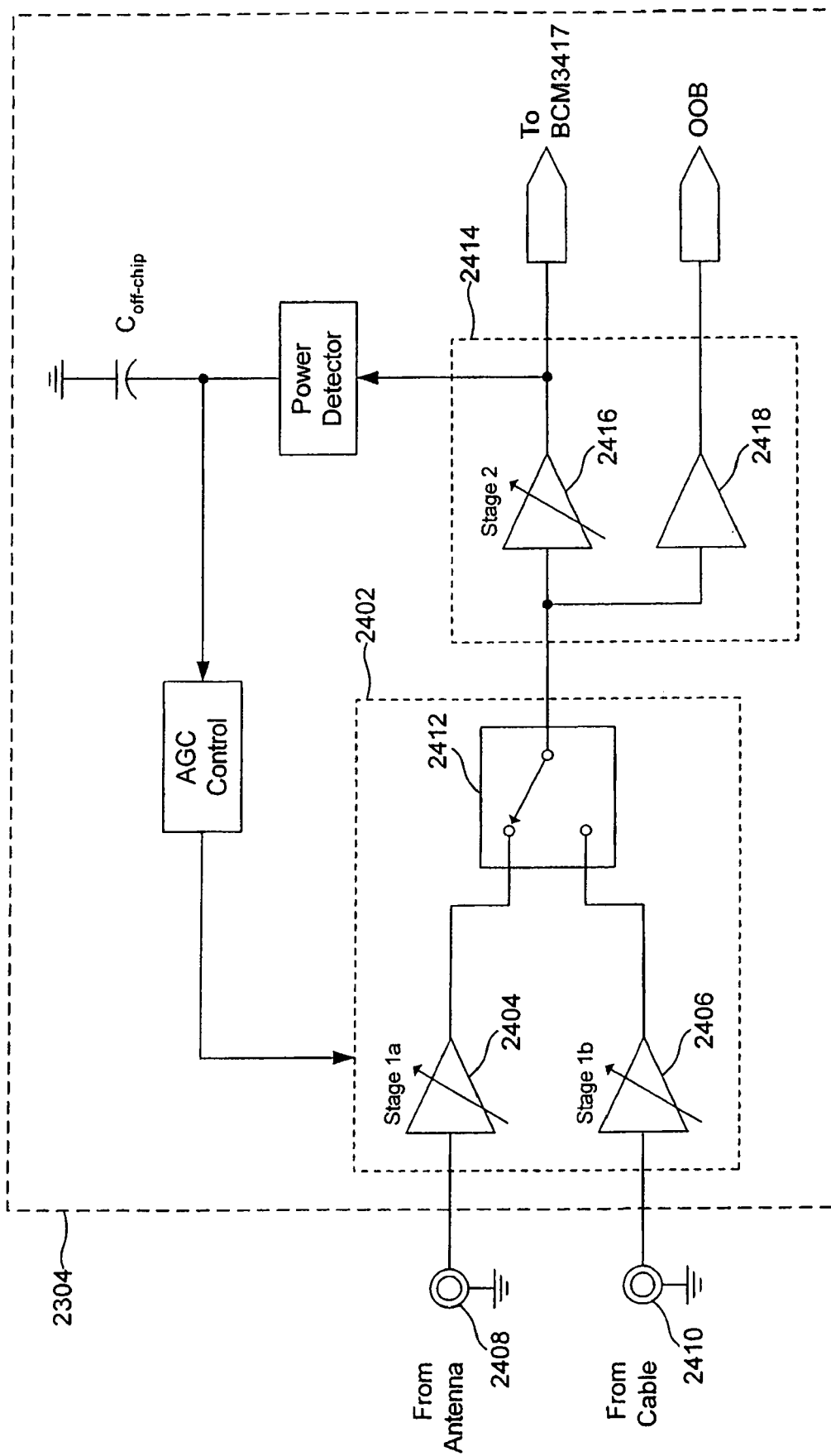
FIG. 24 is a block diagram of the DTV LNA including an optional switched LNA first stage that includes independently controlled LNAs for different inputs, and an out-of-band second stage portion.

Referring to FIG. 24, the DTV LNA 2304 is illustrated with a first stage 2402 and a second stage 2414. The first stage 2402 includes first and second LNAs 2404 and 2406. The first LNA 2404 is coupled to an antenna input 2408. The second LNA 2406 is coupled to a cable input 2410. A gain of the first LNA 2404 can be different than a gain of the second LNA 2406.

A switch 2412 selectively couples an output of either the first LNA 2404 or the second LNA 2406 to the second stage 2414.

C. Out-of-Band Second Stage

The invention further includes an optional out-of-band ("OOB") second stage amplifier for processing data embedded in otherwise unused channels within the cable band, such as a FM band.

Referring to FIG. 24, the second stage 2414 includes third and fourth LNAs 2416 and 2418. The third LNA 2416 is used video. The fourth LNA 2418 serves as a OOB LNA for processing data embedded in otherwise unused channels within the cable band, such as a FM band.

D. Multi-Band Input Filter

The input band typically includes VHF, UHF, FM radio, and aircraft transmissions. When all of these transmissions are processed in the DTV LNA, the AGC may reduce gain because of a large, but unwanted, input signal. The reduced gain will lead to a lower SNR with respect to the signal(s) of interest.

The invention thus includes an optional multi-band input filter, such as a triple-band input filter, and multiple input stages, one for each band (e.g., low-VHF, high-VHF, and UHF). The multi-band filer insures that the AGC operates on the TV band of interest. Amplifiers associated with the filtered band(s) are optionally turned off.

Figure 25:
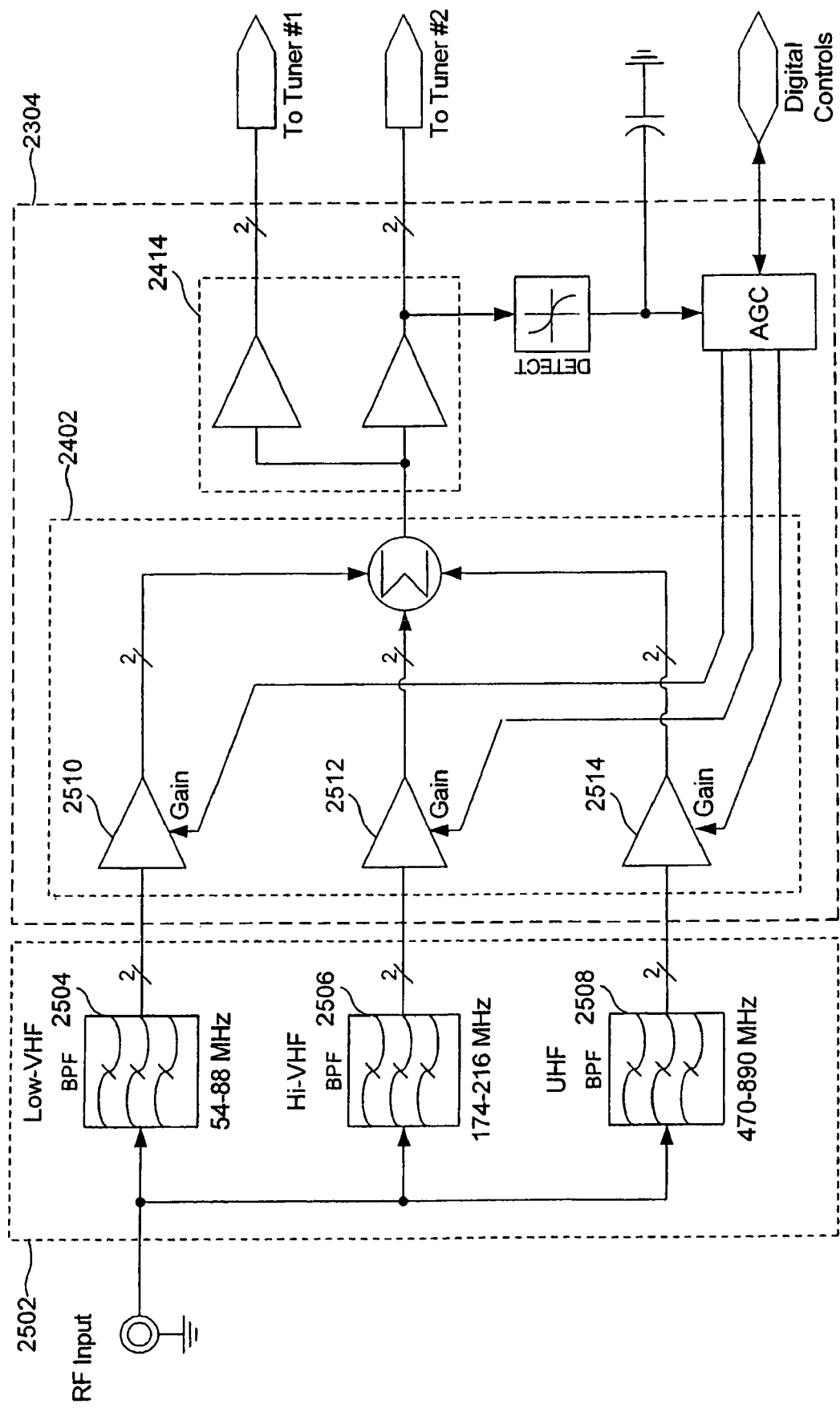
FIG. 25 is a block diagram of a multi-band input filter coupled to an input of the DTV LNA.

Referring to FIG. 25, an example multi-band filter 2502 includes a low-VHF filter 2504, a hi-VHF filter 2506, and a UHF filter 2508. The filters 2504, 2506, and 2508 are band-pass filters. The low-VHF filter 2504 passes a band in the range of approximately 54-99 MHz. The hi-VHF filter 2506 passes a band in the range of approximately 174-216 MHz. The UHF filter 2508 passes a band in the range of approximately 470-890 MHz.

Within the DTV LNA 2304, the first stage 2402 includes corresponding independently controllable gain stages 2510, 2512, and 2514. A gain stage corresponding to a band of interest is controlled as described above. Gain stages corresponding to bands not of interest are optionally disabled or powered down to conserve power.

IX. Conclusion

Further benefits of the invention include, at least, and by way of example and not by limitation, the following:

High bandwidth (i.e. good frequency performance).

Low distortion, especially for large composite channel signals found in cable TV. This is due to connecting the amplifier outputs to VDD via external inductors or ferrites and due to using a resistors and attenuators in the front end of the amplifier assembly (e.g., in the VGA).

Only enough gain reduction is used at the first amplifier stage of the amplifier assembly to insure the largest input signal condition can be met. This allows use of fewer gain stages in the VGA. Gain reduction is achieved through turning OFF gain stages.

Low noise figure.

Good input match (even at different gain settings).

Minimized distortion as the gain is changed. This is accomplished by fully turning OFF or ON all unused gain stages.

Power consumption is lowered as sequential gain stages of the VGA are turned OFF.

Noise figure degradation vs. gain reduction is less than 1:1 for lower gain settings, since attenuation comes at the output after the first 18 dB (done by turning OFF gain stages). This is important when the input signal level is high.

Increased AGC control range: More than 30 dB at 860 MHz and more than 35 dB at lower frequencies.

At a minimum, application is to cable modems, set-top box receivers and analog TV tuners.

Gain in one arrangement is controlled by a combination of selecting amplifiers connected to a tapped resistor ladder and by turning ON and OFF amplifier forming part of gain stages.

IC chip has been designed to use low-cost digital CMOS process. However this is not a limitation as other semiconductor processes could be used including bipolar (including SiGe), BiCMOS or Gallium Arsenide (GaAs) MESFET.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of circuit modules, functional building blocks, and method steps illustrating the performance of specified functions and relationships thereof. The boundaries of these circuit modules, functional building blocks and method steps have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these circuit modules, functional building blocks and modules can be implemented by discrete components including digital and/or analog circuits, application specific integrated circuits, processors executing appropriate software, hardware, firmware and the like or any combination thereof. Thus, the breadth and scope of the present invention should not be limited by any of the above-described exemplary embodiments, but should be defined only in accordance with the following claims and their equivalents.

What is claimed is:

1. An amplifier assembly comprising:
   a first stage amplifier configured to amplify an input signal and to produce at its output a first amplified signal, wherein the first stage amplifier is a Variable Gain Amplifier (VGA), the VGA including a plurality of variable gain stages arranged in parallel and having a gain controlled in response to one or more gain control signals;
   a second stage amplifier coupled to the output of the first stage amplifier, the second stage amplifier being configured to amplify the amplified signal, and to produce at its output a second amplified signal; and
   an Automatic Gain Control (AGC) module configured to generate the one or more gain control signals according to a ramp function in response to a power level of the first amplified signal.

2. The amplifier assembly of claim 1, further comprising:
   a positive-intrinsic-negative (PIN) diode coupled between differential input terminals of the first stage amplifier.

3. The amplifier assembly of claim 1, wherein the gain change of the first stage VGA is smooth and continuous responsive to the ramp function.

4. The amplifier assembly of claim 1, wherein an input of the AGC module is coupled to an output the second stage amplifier.

5. The amplifier assembly of claim 1, wherein the second stage amplifier comprises a second VGA.

6. The amplifier assembly of claim 1, wherein the second stage comprises a plurality of second stage VGAs having different gains.

7. The amplifier assembly of claim 1, wherein the second stage comprises a plurality of second stage amplifiers, including an out-of-band second stage amplifier.

8. The amplifier assembly of claim 1, wherein the input signal is at least one of: a National Television System Committee (NTSC) TV signal, a Phase Alternating Line (PAL) TV signal, a Sequential Color with Memory (SECAM) TV signal, a digital data signal, and a digital TV signal.

9. The amplifier assembly of claim 1, wherein the first stage amplifier is a differential amplifier.

10. The amplifier assembly of claim 1, wherein the second stage amplifier is a differential amplifier.

11. The amplifier assembly of claim 1, wherein the first stage amplifier includes a plurality of gain stages arranged in parallel with each other, and having their respective outputs combined together at the first stage amplifier output.

12. The amplifier assembly of claim 1, further comprising:
   a control interface coupled to the first stage amplifier and each of the second stage amplifiers, the control interface being configured to perform at least one of the following:
   set the gain of the first stage amplifier;
   access the gain of the first stage amplifier; and
   set the gain of each of the second stage amplifiers.

13. The amplifier assembly of claim 1, further comprising:
   an integrated circuit (IC) substrate, the first stage amplifier and the plurality of second stage amplifiers being constructed on the IC substrate; and
   process sense circuits constructed on the IC substrate, each of the process sense circuits producing a respective sensed signal indicative of a process-based parameter of the IC substrate, wherein the process-based parameter is at least one of:
   i) a transconductance of the IC substrate;
   ii) a resistivity per unit area of the IC substrate; and
   iii) a gate-to-source threshold voltage for transistors constructed on the IC substrate.

14. The amplifier assembly of claim 1, further comprising:
   a multi-band input filter coupled to an input of the first stage amplifier.

15. The amplifier assembly of claim 14, wherein the multi-band input filter comprises: a triple-band input filter.

16. The amplifier assembly of claim 15, wherein the triple-band input filter comprises at least one of:
   a low-VHF band-pass filter;
   a hi-VHF band-pass filter; and
   a UHF band-pass filter.

17. The amplifier assembly of claim 16, wherein the low-VHF band-pass filter passes the input signal having a range of approximately 54-99 MHz, the hi-VHF band-pass filter passes the input signal having a range of approximately 174-216 MHz, and the UHF band-pass passes the input signal having a range of approximately 470-890 MHz.

18. The amplifier assembly of claim 1, wherein the first stage amplifier comprises:
   a plurality of first stage amplifiers, each coupled to a corresponding input filter.

19. An amplifier assembly comprising:
   a first stage amplifier configured to amplify an input signal and to produce at its output a first amplified signal, wherein the first stage amplifier is a Variable Gain Amplifier (VGA) with a gain controlled in response to one or more gain control signals; and a second stage amplifier coupled to the output of the first stage amplifier, the second stage amplifier being configured to amplify the first amplified signal, and to produce at its output a second amplified signal, the second stage comprising a plurality of second stage VGAs having different gains, a ratio of the different gains being in a range of ratio 1:1 to 2:1.

20. An amplifier assembly comprising:

a first stage amplifier configured to amplify an input signal and to produce at its output a first amplified signal, the first stage amplifier including:
   an input node,
   a first plurality of amplifiers having their inputs coupled to the input; node,
   an attenuation ladder coupled to the input node, and
   a second plurality of amplifiers having their respective inputs coupled to successive corresponding taps of the attenuation ladder, wherein the outputs of the first plurality of amplifiers and the outputs of the second plurality of amplifiers are combined together at the output of the first stage amplifier, wherein a gain of at least one of first plurality of amplifiers and the second plurality of amplifiers is controlled in response to one or more gain control signals; and a second stage amplifier coupled to the output of the first stage amplifier, the second stage amplifier being configured to amplify the first amplified signal, and to produce at its output a second amplified signal.

21. The amplifier assembly of claim 20, further comprising:
   an integrated circuit (IC) substrate, the first stage amplifier being constructed on the IC substrate; and
   an input resistor external to the IC substrate and coupled to the input node, wherein the input resistor and the attenuation ladder together set an input impedance of the amplifier assembly.

* * * * *

UNITED STATES PATENT AND TRADEMARK OFFICE
CERTIFICATE OF CORRECTION

PATENT NO. : 7,634,244 B2 Page 1 of 1
APPLICATION NO. : 11/139619
DATED : December 15, 2009
INVENTOR(S) : Burns et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 899 days.

Signed and Sealed this

Ninth Day of November, 2010

David J. Kappos
*Director of the United States Patent and Trademark Office*

UNITED STATES PATENT AND TRADEMARK OFFICE
CERTIFICATE OF CORRECTION

PATENT NO. : 7,634,244 B2
APPLICATION NO. : 11/139619
DATED : December 15, 2009
INVENTOR(S) : Burns et al.

It is certified that error appears in the above-identified patent and that said Letters Patent is hereby corrected as shown below:

At the Title page, related U.S. Application Data, please replace section (63) with --Continuation of application no. 11/030,882, filed on Jan. 10, 2005, now Pat. No. 7,260,377, which is a continuation-in-part of application no. 10/353,940, filed on Jan. 30, 2003, now Pat. No. 7,471,941, which claims benefit of provisional application no. 60/430,061, filed on December 2, 2002; said application no. 11/030,882 is a continuation-in-part of application no. 10/353,939, filed on Jan. 30, 2003, now Pat. No. 6,798,286, which claims benefit of provisional application no. 60/430,061, filed on December 2, 2002; said application no. 11/030,882 is a continuation-in-part of application no. 10/882,729, filed on Apr. 13, 2004, now Pat. No. 7,068,100, which is a continuation of application no. 10/353,939, filed on Jan. 30, 2003, now Pat. No. 6,798,286, which claims benefit of provisional application no. 60/430,061, filed on December 2, 2002; and said application no. 11/030,882 claims benefit of provisional application no. 60/572,608, filed on May 20, 2004--.

At column 27, line 51, please replace "amplify the amplified signal" with --amplify the first amplified signal--.

At column 27, line 64, please replace "an output the" with --an output of the--.

At column 29, line 14, please replace "input; node," with --input node,--.

Signed and Sealed this

Seventh Day of December, 2010

David J. Kappos
*Director of the United States Patent and Trademark Office*